US010593789B2

(12) United States Patent
Suzuki et al.

(10) Patent No.: US 10,593,789 B2
(45) Date of Patent: Mar. 17, 2020

(54) SEMICONDUCTOR APPARATUS AND METHOD OF MANUFACTURING THE SAME

(71) Applicant: Mitsubishi Electric Corporation, Tokyo (JP)

(72) Inventors: Kenji Suzuki, Tokyo (JP); Mitsuru Kaneda, Tokyo (JP); Koichi Nishi, Toyota (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/117,102

(22) Filed: Aug. 30, 2018

(65) Prior Publication Data

US 2019/0103479 A1     Apr. 4, 2019

(30) Foreign Application Priority Data

Sep. 29, 2017   (JP) ................. 2017-191043

(51) Int. Cl.

| H01L 29/739 | (2006.01) |
|---|---|
| H01L 29/10 | (2006.01) |
| H01L 21/265 | (2006.01) |
| H01L 29/66 | (2006.01) |
| H01L 29/06 | (2006.01) |
| H01L 29/423 | (2006.01) |
| H01L 29/36 | (2006.01) |
| H01L 29/40 | (2006.01) |

(52) U.S. Cl.
CPC .... *H01L 29/7397* (2013.01); *H01L 21/26513* (2013.01); *H01L 29/0619* (2013.01); *H01L 29/0638* (2013.01); *H01L 29/1095* (2013.01); *H01L 29/36* (2013.01); *H01L 29/4238* (2013.01); *H01L 29/66333* (2013.01); *H01L 29/66348* (2013.01); *H01L 29/7395* (2013.01); *H01L 29/402* (2013.01)

(58) Field of Classification Search
CPC ............. H01L 29/0619; H01L 29/0638; H01L 29/1095; H01L 29/7397; H01L 29/36
See application file for complete search history.

(56) References Cited

U.S. PATENT DOCUMENTS

| 2008/0093623 A1 | 4/2008 | Kono |
|---|---|---|
| 2014/0299915 A1 | 10/2014 | Kouno et al. |
| 2018/0019131 A1 | 1/2018 | Suzuki et al. |

FOREIGN PATENT DOCUMENTS

| JP | H09-121052 A | 5/1997 |
|---|---|---|
| JP | 2005-354008 A | 12/2005 |
| JP | 2011-114027 A | 6/2011 |
| JP | 2013-138172 A | 7/2013 |
| WO | 2016/147264 A1 | 9/2016 |

*Primary Examiner* — Wael M Fahmy
*Assistant Examiner* — Sarah K Salerno
(74) *Attorney, Agent, or Firm* — Studebaker & Brackett PC

(57) ABSTRACT

A semiconductor apparatus includes a semiconductor substrate including a semiconductor device. The semiconductor device includes a first n-type buffer layer, a second n-type buffer layer, and a first p-type semiconductor region. A first maximum peak concentration of first n-type carriers contained in the first n-type buffer layer is smaller than a second maximum peak concentration of second n-type carriers contained in the second n-type buffer layer. The first p-type semiconductor region is formed in the first n-type buffer layer. The first p-type semiconductor region has a narrower width than the first n-type buffer layer.

17 Claims, 20 Drawing Sheets

SEMICONDUCTOR APPARATUS AND METHOD OF MANUFACTURING THE SAME

BACKGROUND OF THE INVENTION

Field of the Invention

The present invention relates to a semiconductor apparatus and a method of manufacturing the same.

Description of the Background Art

Japanese Patent Laying-Open No. 2013-138172 discloses a semiconductor apparatus including a field stop layer. The field stop layer includes a first layer doped with phosphorus or arsenic and a second layer doped with protons.

SUMMARY OF THE INVENTION

An object of the present invention is to improve the short circuit capacity of a semiconductor apparatus in load short circuit.

A semiconductor apparatus of the present invention includes a semiconductor substrate including a semiconductor device. The semiconductor substrate has a front surface and a rear surface. The semiconductor device includes an n-type drift region, a first n-type buffer layer, a second n-type buffer layer, and a first p-type semiconductor region. The first n-type buffer layer is in contact with the n-type drift region and is provided on a rear surface side with respect to the n-type drift region. The second n-type buffer layer is in contact with the first n-type buffer layer and is provided on a rear surface side with respect to the first n-type buffer layer. A first maximum peak concentration of first n-type carriers in the first n-type buffer layer is lower than a second maximum peak concentration of second n-type carriers in the second n-type buffer layer. The first n-type buffer layer is thicker than the second n-type buffer layer. The first p-type semiconductor region is formed inside the first n-type buffer layer. The first p-type semiconductor region has a narrower width than the first n-type buffer layer in the direction in which the n-type emitter region and the gate electrode are arranged.

A method of manufacturing a semiconductor apparatus of the present invention includes preparing a semiconductor substrate. The semiconductor substrate has a front surface and a rear surface. The semiconductor substrate includes an n-type drift region. The method of manufacturing a semiconductor apparatus of the present invention further includes forming a first n-type buffer layer, forming a first p-type semiconductor region inside the first n-type buffer layer, and forming a second n-type buffer layer. The first n-type buffer layer is in contact with the n-type drift region and is provided on a rear surface side with respect to the n-type drift region. The second n-type buffer layer is in contact with the first n-type buffer layer and is provided on a rear surface side with respect to the first n-type buffer layer. A first maximum peak concentration of first n-type carriers in the first n-type buffer layer is lower than a second maximum peak concentration of second n-type carriers in the second n-type buffer layer. The first n-type buffer layer is thicker than the second n-type buffer layer. The first p-type semiconductor region has a narrower width than the first n-type buffer layer in the direction in which an n-type emitter region and the gate electrode are arranged.

In load short circuit, the first p-type semiconductor region suppresses decreases in the hole concentrations in the n-type drift region and the first n-type buffer layer and also reduces the electric field intensity in a boundary region between the n-type drift region and the first n-type buffer layer. The semiconductor apparatus and the method of manufacturing the same according to the present invention can improve the short circuit capacity in load short circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
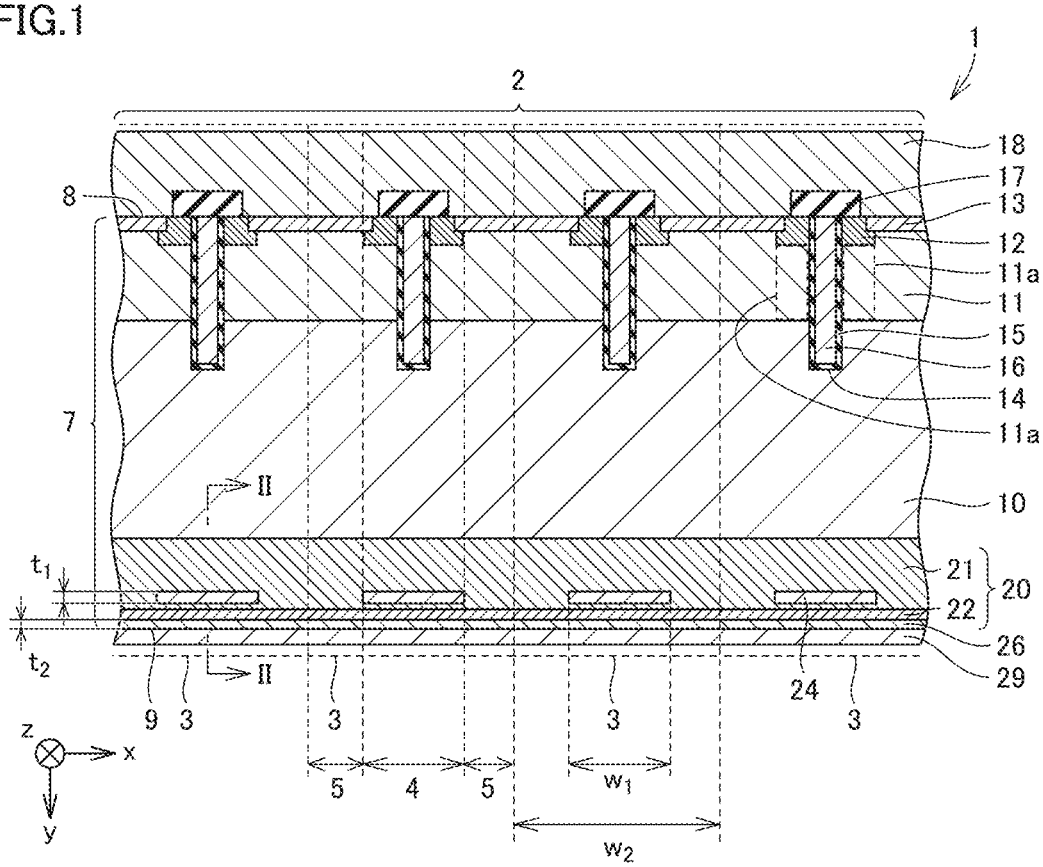
FIG. 1 is a schematic partially-enlarged sectional view of a semiconductor apparatus according to Embodiment 1.

Embodiments of the present invention will be described below. The same or corresponding components are denoted by the same reference signs, and a description thereof will not be repeated.

Embodiment 1

A semiconductor apparatus 1 according to Embodiment 1 will be described with reference to FIGS. 1 and 2.

Semiconductor apparatus 1 of the present embodiment includes a semiconductor substrate 7. Semiconductor substrate 7 may be any type of substrate, such as a silicon substrate or silicon carbide substrate. In the present embodiment, semiconductor substrate 7 is a silicon substrate. Semiconductor substrate 7 has a front surface 8 and a rear surface 9. Front surface 8 and rear surface 9 each extend in a first direction (x direction) and a second direction (z direction) orthogonal to the first direction. Front surface 8 is opposite to rear surface 9 in a third direction (y direction) orthogonal to the first direction and the second direction. Semiconductor substrate 7 has, for example, a thickness of 110 μm. The thickness of semiconductor substrate 7 is defined as a distance between front surface 8 and rear surface 9 in the third direction.

Semiconductor substrate 7 includes a cell region 2 in which at least one semiconductor device 3 is provided. Semiconductor apparatus 1 (semiconductor device 3) may be, for example, an insulated gate bipolar transistor (IGBT).

Semiconductor device 3 includes an n-type drift region 10, a p-type base region 11, an n-type emitter region 12, a gate insulating film 15, a gate electrode 16, and a p-type collector layer 26. Semiconductor device 3 may further include a p-type contact layer 13.

N-type drift region 10 may be, for example, an n⁻-type region. P-type base region 11 is provided on a front surface 8 side with respect to n-type drift region 10. P-type base region 11 may be formed having a first depth from front surface 8. N-type emitter region 12 is formed in a part of p-type base region 11. N-type emitter region 12 may be formed having a second depth from front surface 8. The second depth is smaller than the first depth. N-type emitter region 12 may be, for example, an n⁺-type region. N-type emitter region 12 may be formed in a part of front surface 8. P-type contact layer 13 may be, for example, a p⁺-type region. P-type contact layer 13 has a hole concentration higher than that of p-type base region 11. P-type contact layer 13 may be formed in a part of front surface 8 in which n-type emitter region 12 is not formed.

Gate insulating film 15 is provided on a portion 11a of p-type base region 11 sandwiched between n-type emitter region 12 and n-type drift region 10. In ON operation of semiconductor device 3, a channel is formed in portion 11a of p-type base region 11. Particularly, gate insulating film 15 may be formed on a side wall and a bottom surface of a trench 14 that penetrates n-type emitter region 12 and p-type base region 11 to reach n-type drift region 10. Gate insulating film 15 may be, for example, a $SiO_2$ film.

Figure 26:
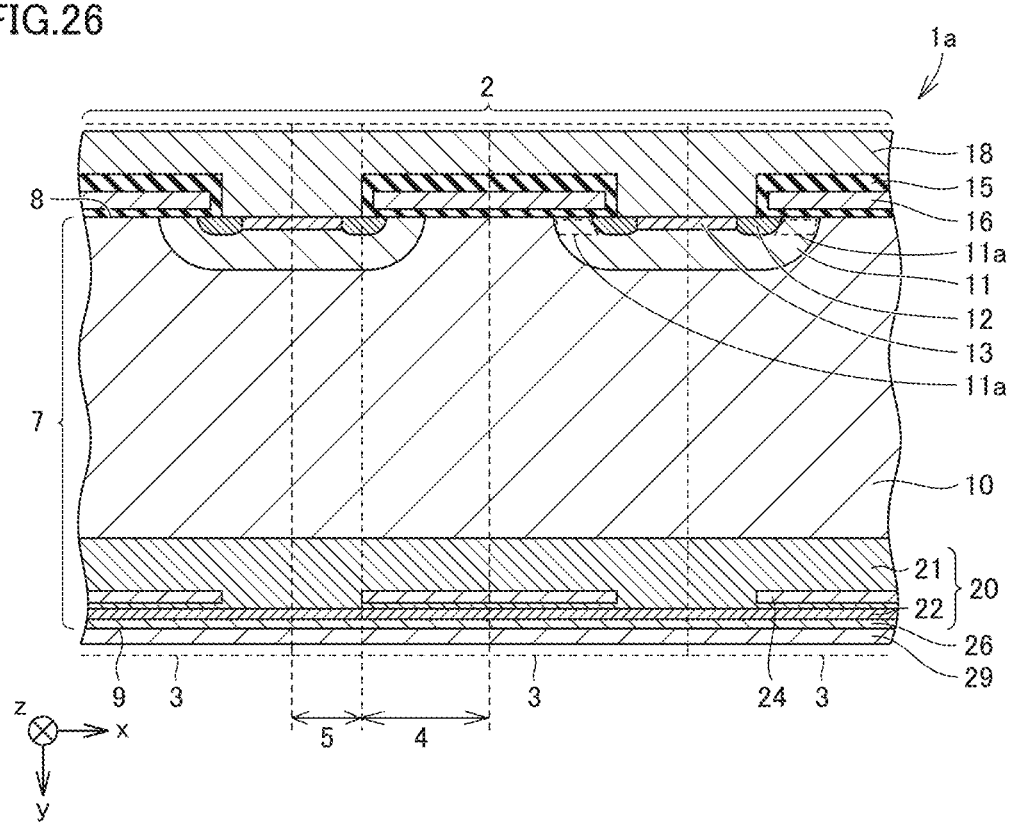
FIG. 26 is a schematic partially-enlarged sectional view of a semiconductor apparatus according to a modification of Embodiment 1.

Gate electrode 16 faces portion 11a of p-type base region 11 with gate insulating film 15 between gate electrode 16 and portion 11a. Particularly, gate electrode 16 may be a trench gate electrode, and semiconductor apparatus 1 may include a trench gate IGBT. Gate electrode 16 is provided in trench 14 with gate insulating film 15 therebetween. As shown in FIG. 26, in a semiconductor apparatus 1a of a modification of the present embodiment, gate electrode 16 may be a planar gate electrode provided on front surface 8 of semiconductor substrate 7 with gate insulating film 15 between gate electrode 16 and front surface 8, and semiconductor apparatus 1a may include a planar gate IGBT. In semiconductor apparatus 1a of the modification of the present embodiment, gate insulating film 15 may be further provided between gate electrode 16 and a first electrode 18. Gate insulating film 15 may electrically insulate gate electrode 16 from first electrode 18.

P-type collector layer 26 is provided in rear surface 9 of semiconductor substrate 7. P-type collector layer 26 is provided on a rear surface 9 with respect to a second n-type buffer layer 22. P-type collector layer 26 may be in contact with second n-type buffer layer 22. P-type collector layer 26 contains a second p-type dopant. The second p-type dopant may be, for example, boron. The dopant may be identified by, for example, secondary ion mass spectrometry (SIMS). P-type collector layer 26 may have a second p-type carrier (hole) concentration of $3.0 \times 10^{17}$ cm$^{-3}$ or higher. P-type collector layer 26 may be, for example, p$^+$-type layer.

Semiconductor device 3 includes a first n-type buffer layer 21, second n-type buffer layer 22, and a first p-type semiconductor region 24. First n-type buffer layer 21 and second n-type buffer layer 22 function as a field stop layer 20.

First n-type buffer layer 21 is in contact with n-type drift region 10 and is provided on a rear surface 9 side with respect to n-type drift region 10. First n-type buffer layer 21 may be an n-type layer. First n-type buffer layer 21 has an n-type carrier (electron) concentration higher than that of n-type drift region 10. First n-type buffer layer 21 may have, for example, a first n-type carrier (electron) concentration of $1.0 \times 10^{14}$ cm$^{-3}$ or higher and $5.0 \times 10^{15}$ cm$^{-3}$ or lower. First n-type buffer layer 21 contains a first n-type dopant. The first n-type dopant may contain protons. As shown in FIG. 2, first n-type buffer layer 21 may have a plurality of peak concentrations of first n-type carriers. The plurality of peak concentrations may decrease with an increasing distance from rear surface 9. The distribution of the carrier concentration in the third direction (y direction) perpendicular to rear surface 9 may be measured by, for example, spreading resistance analysis (SRA).

Second n-type buffer layer 22 is in contact with first n-type buffer layer 21 and is provided on a rear surface 9 side with respect to first n-type buffer layer 21. Second n-type buffer layer 22 may be an n-type layer. Second n-type buffer layer 22 contains a second n-type dopant. The second n-type dopant may contain phosphorus or arsenic.

Figure 2:
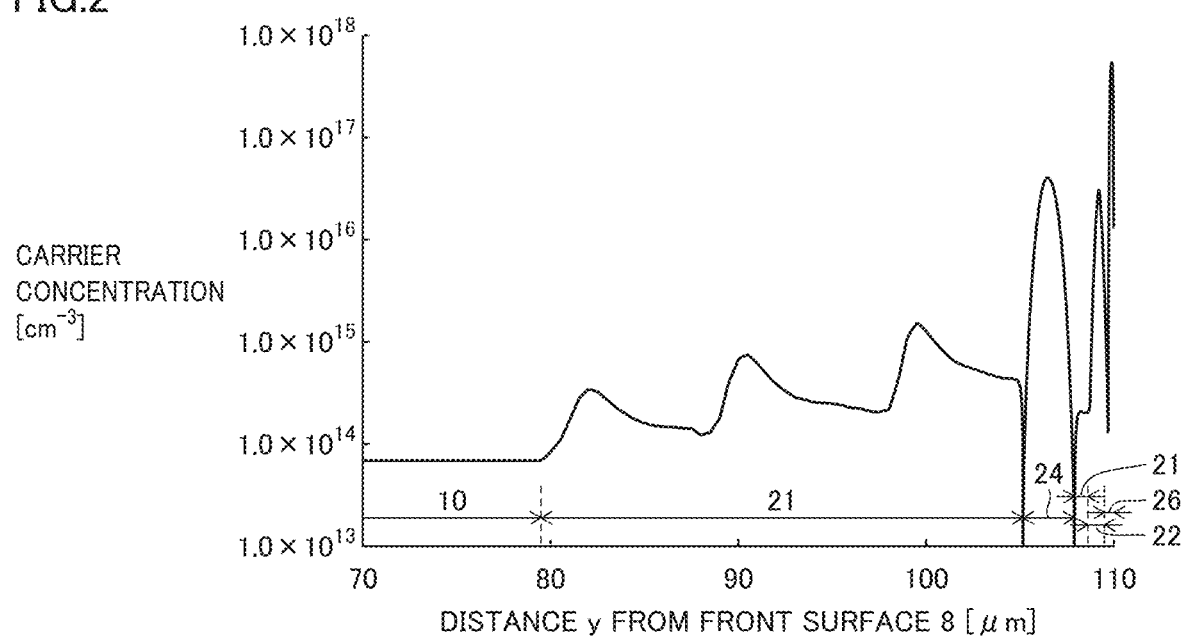
FIG. 2 shows a profile of a carrier concentration of the semiconductor apparatus according to Embodiment 1, which is taken along a section line II-II shown in FIG. 1.

As shown in FIG. 2, a first maximum peak concentration of the first n-type carriers in first n-type buffer layer 21 may be smaller than a second maximum peak concentration of the second n-type carriers (electrons) in second n-type buffer layer 22. First n-type buffer layer 21 is thicker than second n-type buffer layer 22.

First p-type semiconductor region 24 is formed inside first n-type buffer layer 21. First p-type semiconductor region 24 is spaced away from p-type collector layer 26 and p-type base region 11. First p-type semiconductor region 24 may be a floating p-type region. First p-type semiconductor region 24 is surrounded by an n-type semiconductor region or an n-type semiconductor layer (e.g., first n-type buffer layer 21). First p-type semiconductor region 24 may be spaced away from second n-type buffer layer 22 and n-type drift region 10. First p-type semiconductor region 24 may be in contact with one of second n-type buffer layer 22 and n-type drift region 10.

First p-type semiconductor region 24 has a narrower width than first n-type buffer layer 21 in the first direction (x direction) in which n-type emitter region 12 and gate electrode 16 are arranged. First p-type semiconductor region 24 has a narrower width than first n-type buffer layer 21 in the first direction (x direction) in which a plurality of semiconductor devices 3 are arranged. A width $w_1$ of first p-type semiconductor region 24 is smaller than a width $w_2$ of first n-type buffer layer 21.

In the first direction (x direction) in which n-type emitter region 12 and gate electrode 16 are arranged, a plurality of semiconductor devices 3 may be arranged. In the first direction (x direction), two first p-type semiconductor regions 24 included in two adjacent semiconductor devices 3 may be separated from each other by a first n-type buffer layer 21 included in these two semiconductor devices 3. In the first direction (x direction), first p-type semiconductor region 24 included in one semiconductor device 3 may be divided into a plurality of portions. In the first direction (x direction), the two portions of first p-type semiconductor region 24 included in two adjacent semiconductor devices 3 may be apart from or in contact with each other.

In a plan view of front surface 8, first p-type semiconductor region 24 may overlap gate electrode 16. First p-type semiconductor region 24 may be formed selectively in a portion of first n-type buffer layer 21 which overlaps gate electrode 16 in the plan view of front surface 8. In the plan view of front surface 8, first p-type semiconductor region 24 may further overlap portion 11a of p-type base region 11. In the plan view of front surface 8, first p-type semiconductor region 24 may further overlap n-type emitter region 12.

In the first direction (x direction) in which n-type emitter region 12 and gate electrode 16 are arranged, first p-type semiconductor region 24 is provided only in a first region 4 of semiconductor device 3. In the first direction (x direction) in which n-type emitter region 12 and gate electrode 16 are arranged, first p-type semiconductor region 24 is not provided in a second region 5 of semiconductor device 3. First region 4 is a region including gate electrode 16 in the plan view of front surface 8. In the first direction (x direction) in which n-type emitter region 12 and gate electrode 16 are arranged, first region 4 may be separated from second region 5 by a plane perpendicular to front surface 8 or rear surface 9. In the plan view of front surface 8, first region 4 may be a region including portion 11a of p-type base region 11. In the plan view of front surface 8, second region 5 is a region free from gate electrode 16. In the plan view of front surface 8, second region 5 may be a region free from portion 11a of p-type base region 11. In the plan view of front surface 8, no first p-type semiconductor region 24 may be provided in at least a part of first n-type buffer layer 21 opposite to gate electrode 16 with respect to n-type emitter region 12 (a portion of first n-type buffer layer 21 included in second region 5).

First p-type semiconductor region 24 contains a first p-type dopant. The first p-type dopant may be, for example, boron. First p-type semiconductor region 24 may have a first p-type carrier (hole) concentration of $3.0 \times 10^{16}$ cm$^{-3}$ or higher. As shown in FIG. 2, a third maximum peak concentration of first p-type carriers in first p-type semiconductor region 24 may be higher than the second maximum peak concentration of the second n-type carriers in second n-type buffer layer 22. The third maximum peak concentration of the first p-type carriers in first p-type semiconductor region 24 may be lower than a fourth maximum peak concentration of second p-type carriers in p-type collector layer 26.

As shown in FIG. 1, first p-type semiconductor region 24 may be thicker than p-type collector layer 26. A thickness $t_1$ of first p-type semiconductor region 24 may be greater than a thickness $t_2$ of p-type collector layer 26. Thickness $t_1$ of first p-type semiconductor region 24 is a length of first p-type semiconductor region 24 in the third direction (y direction) perpendicular to front surface 8. A thickness $t_2$ of p-type collector layer 26 is a length of p-type collector layer 26 in the third direction (y direction) perpendicular to front surface 8.

Semiconductor device 3 may further include first electrode 18 and a second electrode 29. First electrode 18 is formed on n-type emitter region 12 in front surface 8. First electrode 18 is also formed on p-type contact layer 13 in front surface 8. First electrode 18 is in contact with n-type emitter region 12 and p-type contact layer 13. First electrode 18 functions as an emitter electrode. First electrode 18 is electrically connected to p-type base region 11 with p-type contact layer 13 therebetween. First electrode 18 is electrically insulated from gate electrode 16 by an interlayer insulation film 17. Second electrode 29 is formed on p-type collector layer 26 in rear surface 9. Second electrode 29 is in contact with p-type collector layer 26. Second electrode 29 functions as a collector electrode.

An example of a method of manufacturing semiconductor apparatus 1 according to Embodiment 1 will be described with reference to FIGS. 1 to 12.

Figure 3:
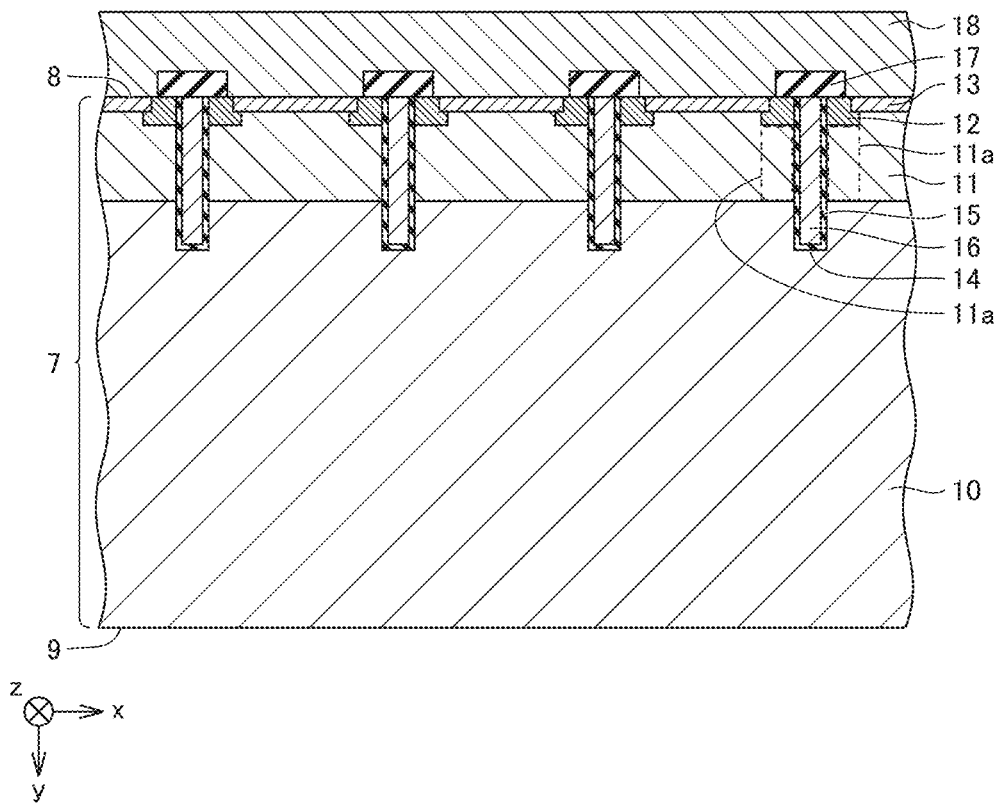
FIG. 3 is a schematic partially-enlarged sectional view showing one step of a method of manufacturing the semiconductor apparatus according to Embodiment 1.

As shown in FIG. 3, the method of manufacturing semiconductor apparatus 1 of the present embodiment includes preparing semiconductor substrate 7.

Semiconductor substrate 7 has front surface 8 and rear surface 9. Semiconductor substrate 7 includes n-type drift region 10, p-type base region 11, n-type emitter region 12, gate insulating film 15, and gate electrode 16. Semiconductor substrate 7 may further include p-type contact layer 13. Gate insulating film 15 is provided on portion 11a of p-type base region 11 sandwiched between n-type emitter region 12 and n-type drift region 10. Gate electrode 16 faces portion 11a of p-type base region 11 with gate insulating film 15 between gate electrode 16a and portion 11a. First electrode 18 is provided on front surface 8 of semiconductor substrate 7. First electrode 18 is in contact with n-type emitter region 12 and p-type contact layer 13. First electrode 18 is electrically insulated from gate electrode 16 by interlayer insulation film 17.

Figure 4:
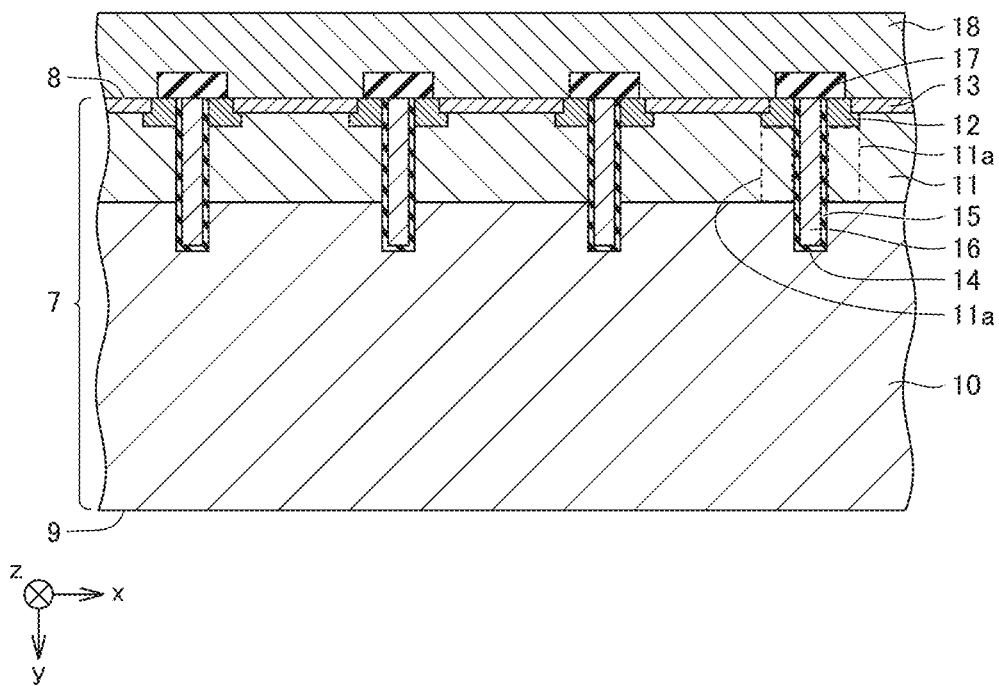
FIG. 4 is a schematic partially-enlarged sectional view showing a step following the step shown in FIG. 3 in the method of manufacturing the semiconductor apparatus according to Embodiment 1.

As shown in FIG. 4, the method of manufacturing semiconductor apparatus 1 of the present embodiment may include thinning semiconductor substrate 7 by processing rear surface 9 of semiconductor substrate 7. For example, rear surface 9 of semiconductor substrate 7 may be ground with a grinder or may be subjected to wet etching. Semiconductor substrate 7 may be thinned to, for example, a thickness of 110 μm.

Figure 5:
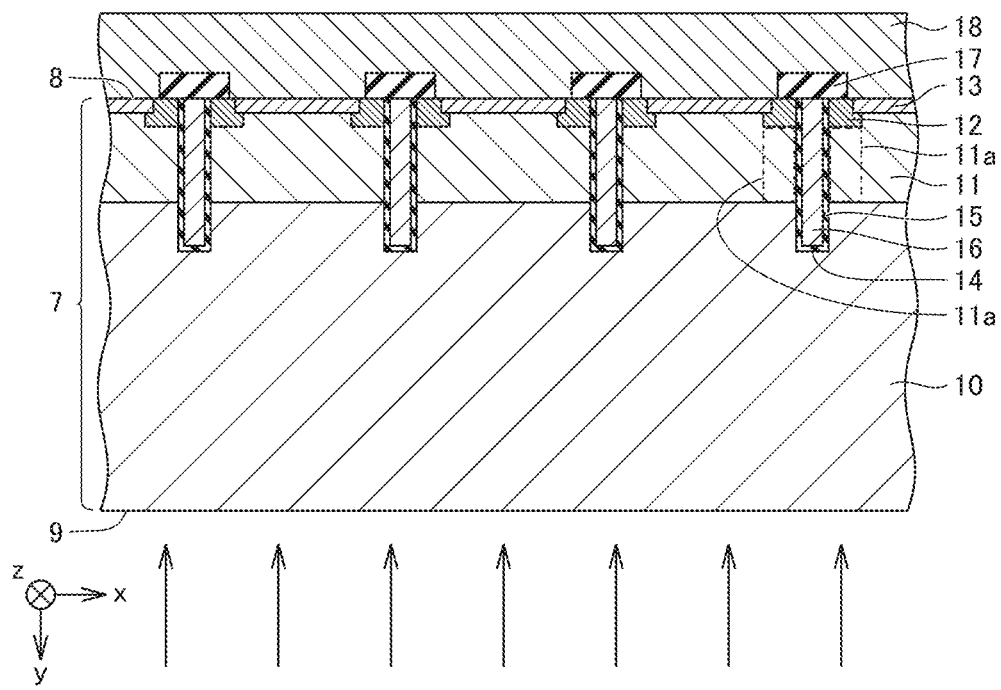
FIG. 5 is a schematic partially-enlarged sectional view showing a step following the step shown in FIG. 4 in the method of manufacturing the semiconductor apparatus according to Embodiment 1.
Figure 6:
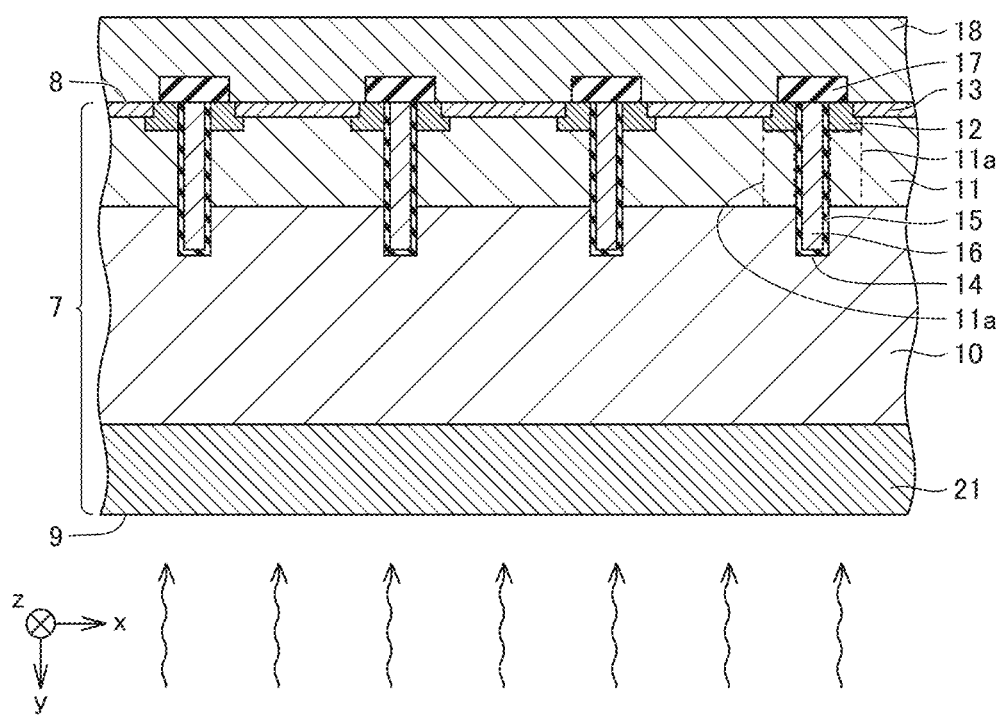
FIG. 6 is a schematic partially-enlarged sectional view showing a step following the step shown in FIG. 5 in the method of manufacturing the semiconductor apparatus according to Embodiment 1.

As shown in FIGS. 5 and 6, the method of manufacturing semiconductor apparatus 1 of the present embodiment includes forming first n-type buffer layer 21 by doping with a first n-type dopant from rear surface 9. First n-type buffer layer 21 is in contact with n-type drift region 10 and is provided on a rear surface 9 side with respect to n-type drift region 10. The first n-type dopant may be, for example, proton.

Particularly, doping of the first n-type dopant may include implanting the first n-type dopant into semiconductor substrate 7 several times at different acceleration voltages. As shown in FIG. 2, first n-type buffer layer 21 may have a plurality of peak concentrations of the first n-type carriers, and the plurality of peak concentrations may decrease with an increasing distance from rear surface 9. Specifically, first n-type buffer layer 21 may be formed by implanting protons into rear surface 9 of semiconductor substrate 7 several times at different acceleration voltages of 500 keV or higher and 1.5 MeV or lower with an ion implanter. The amount of the first n-type dopant to be implanted may be decreased with a higher acceleration voltage of the first n-type dopant. At an acceleration voltage of 500 keV, the range of proton is approximately 6 μm. At an acceleration voltage of 1.5 MeV, the range of proton is approximately 30 μm.

As shown in FIG. 6, in order to activate the first n-type dopant, first n-type buffer layer 21 may be annealed by heat application to first n-type buffer layer 21. First n-type buffer layer 21 may be annealed at, for example, a temperature of 350° C. or higher and 450° C. or lower. Specifically, first n-type buffer layer 21 may be subjected to furnace annealing. The activation rate of the first n-type dopant by furnace annealing is from approximately 0.5% to approximately 1%.

Figure 7:
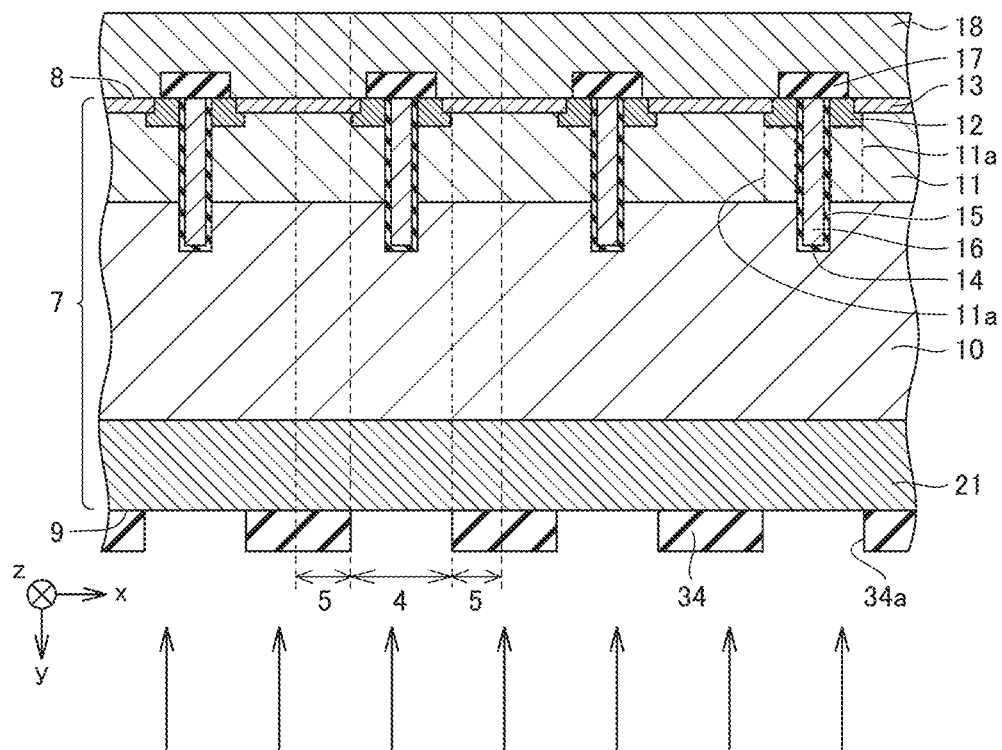
FIG. 7 is a schematic partially-enlarged sectional view showing a step following the step shown in FIG. 6 in the method of manufacturing the semiconductor apparatus according to Embodiment 1.
Figure 8:
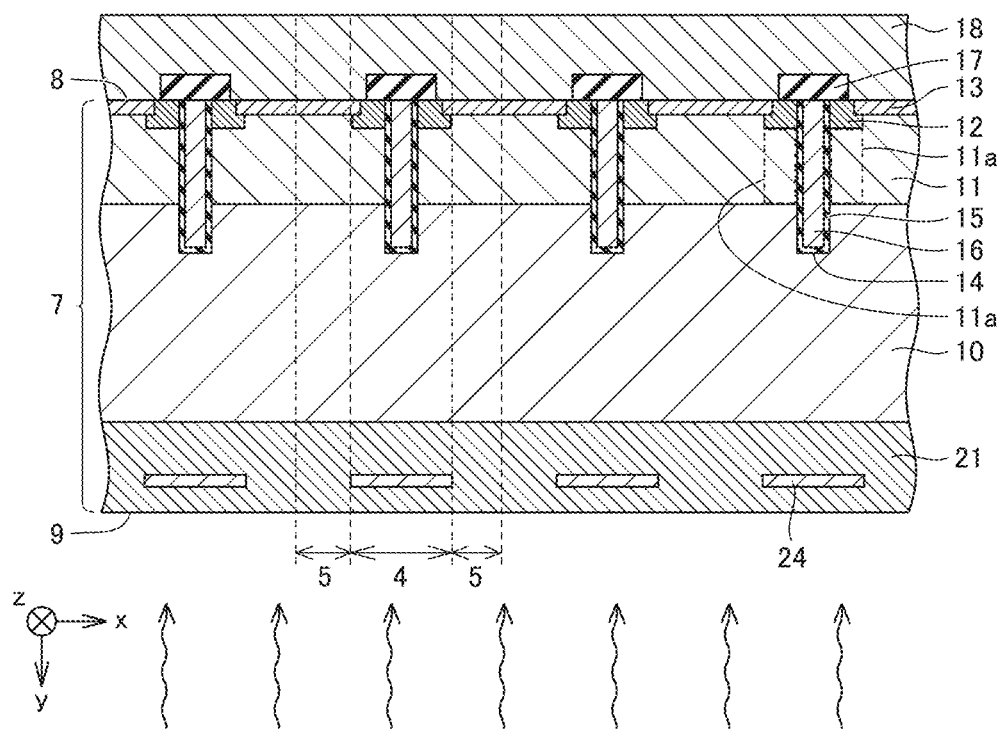
FIG. 8 is a schematic partially-enlarged sectional view showing a step following the step shown in FIG. 7 in the method of manufacturing the semiconductor apparatus according to Embodiment 1.

As shown in FIGS. 7 and 8, the method of manufacturing semiconductor apparatus 1 of the present embodiment includes forming first p-type semiconductor region 24 inside first n-type buffer layer 21 by doping the first p-type dopant from rear surface 9. The first p-type dopant may be, for example, boron. First p-type semiconductor region 24 has a narrower width than first n-type buffer layer 21 in the first direction (x direction) in which n-type emitter region 12 and gate electrode 16 are arranged. Particularly, first p-type semiconductor region 24 may overlap gate electrode 16 in the plan view of front surface 8. First p-type semiconductor region 24 may be formed selectively in the portion of first n-type buffer layer 21 which overlaps gate electrode 16 in the plan view of front surface 8. In the plan view of front surface 8, first p-type semiconductor region 24 may further overlap portion 11a of p-type base region 11. In the plan view of front surface 8, no first p-type semiconductor region 24 may be provided in at least a part of first n-type buffer layer 21 opposite to gate electrode 16 with respect to n-type emitter region 12.

Specifically, a mask 34 having an opening 34a is formed on rear surface 9 of semiconductor substrate 7. First region 4 including gate electrode 16 is exposed through opening 34a of mask 34. Second region 5 is covered with mask 34. The first p-type dopant is implanted into first n-type buffer layer 21 through opening 34a of mask 34. The first p-type dopant is implanted only into first n-type buffer layer 21 in first region 4. The first p-type dopant is not implanted into first n-type buffer layer 21 in second region 5. Consequently, first p-type semiconductor region 24 can be formed selectively only in first region 4. First p-type semiconductor region 24 may be formed by implanting boron into first n-type buffer layer 21 at an acceleration voltage of 1 MeV or higher with an ion implanter.

As shown in FIG. 8, in order to activate the first p-type dopant, first p-type semiconductor region 24 may be annealed by heat application to first p-type semiconductor region 24. Specifically, first p-type semiconductor region 24 may be subjected to laser annealing.

Figure 9:
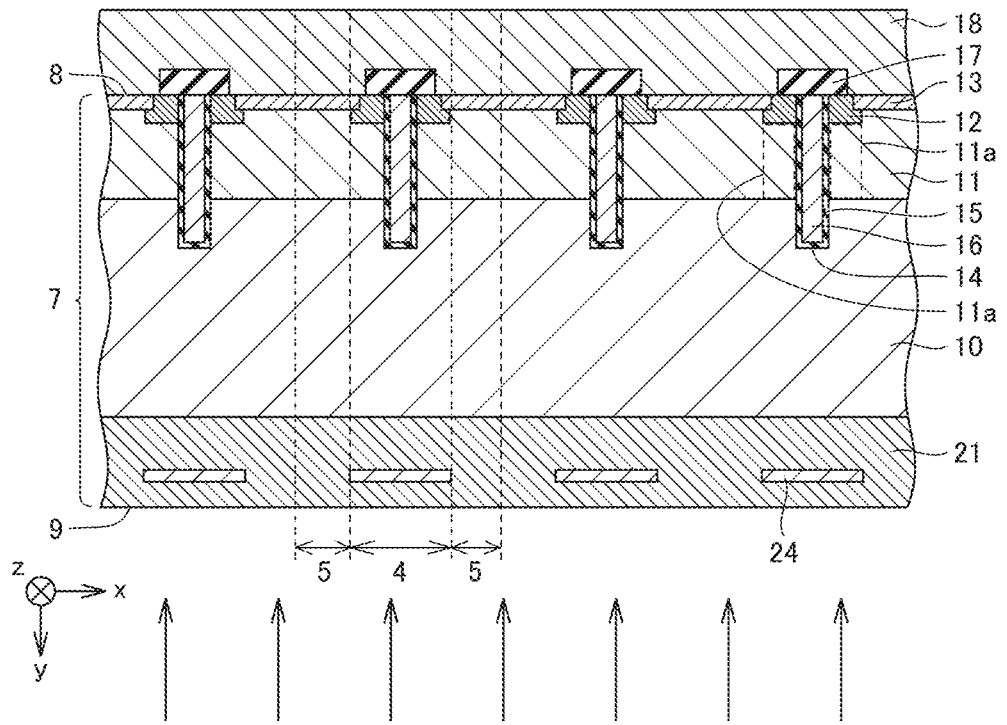
FIG. 9 is a schematic partially-enlarged sectional view showing a step following the step shown in FIG. 8 in the method of manufacturing the semiconductor apparatus according to Embodiment 1.
Figure 10:
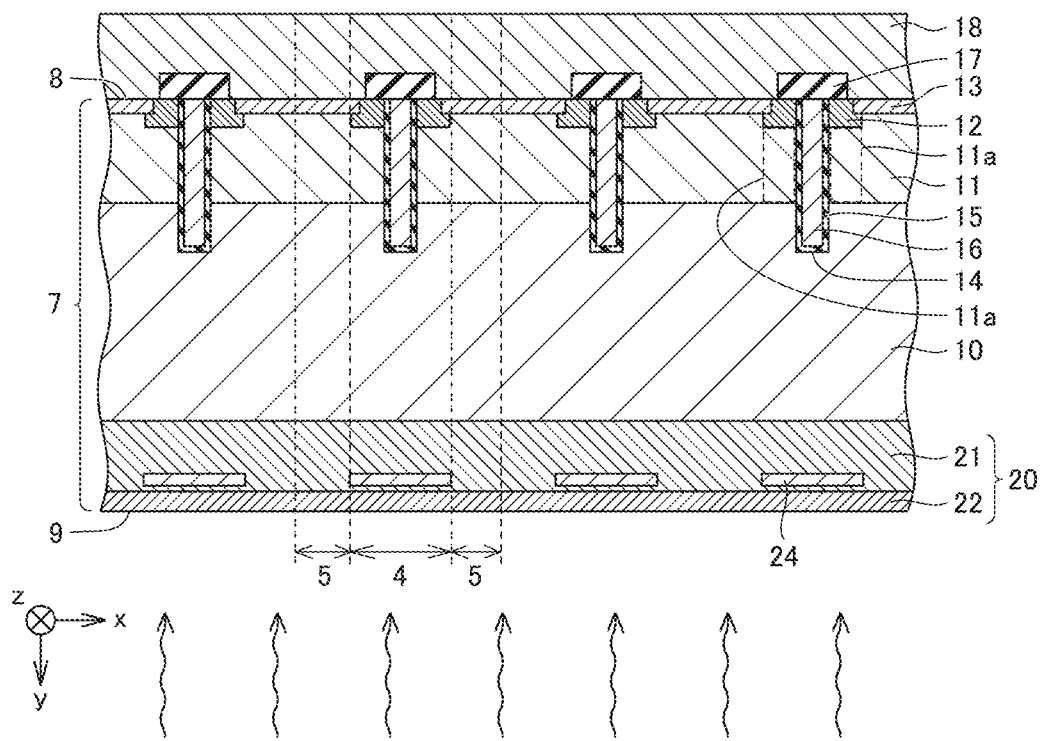
FIG. 10 is a schematic partially-enlarged sectional view showing a step following the step shown in FIG. 9 in the method of manufacturing the semiconductor apparatus according to Embodiment 1.

As shown in FIGS. 9 and 10, the method of manufacturing semiconductor apparatus 1 of the present embodiment includes forming second n-type buffer layer 22 by doping with a second n-type dopant from rear surface 9 of semiconductor substrate 7. Second n-type buffer layer 22 is in contact with first n-type buffer layer 21 and is provided on a rear surface 9 side with respect to first n-type buffer layer 21. The first maximum peak concentration of the first n-type carriers in first n-type buffer layer 21 is smaller than the second maximum peak concentration of the second n-type carriers in second n-type buffer layer 22. First n-type buffer layer 21 is thicker than second n-type buffer layer 22.

The second n-type dopant may be, for example, phosphorus or arsenic. Specifically, second n-type buffer layer 22 may be formed by implanting phosphorus or arsenic into first n-type buffer layer 21 at an acceleration voltage of 1 MeV or higher with an ion implanter.

As shown in FIG. 10, in order to activate the second n-type dopant, second n-type buffer layer 22 may be annealed by heat application to second n-type buffer layer 22. Specifically, second n-type buffer layer 22 may be subjected to laser annealing. The activation rate of the second n-type dopant by laser annealing is from approximately 60% to approximately 75%. Thus, even when the amount of the second n-type dopant implanted is smaller than the amount of the first n-type dopant implanted, the second maximum peak concentration of the second n-type carriers in second n-type buffer layer 22 can be higher than the first maximum peak concentration of the first n-type carriers in first n-type buffer layer 21. This can reduce damage to semiconductor substrate 7 due to the implantation of the second n-type dopant.

Figure 11:
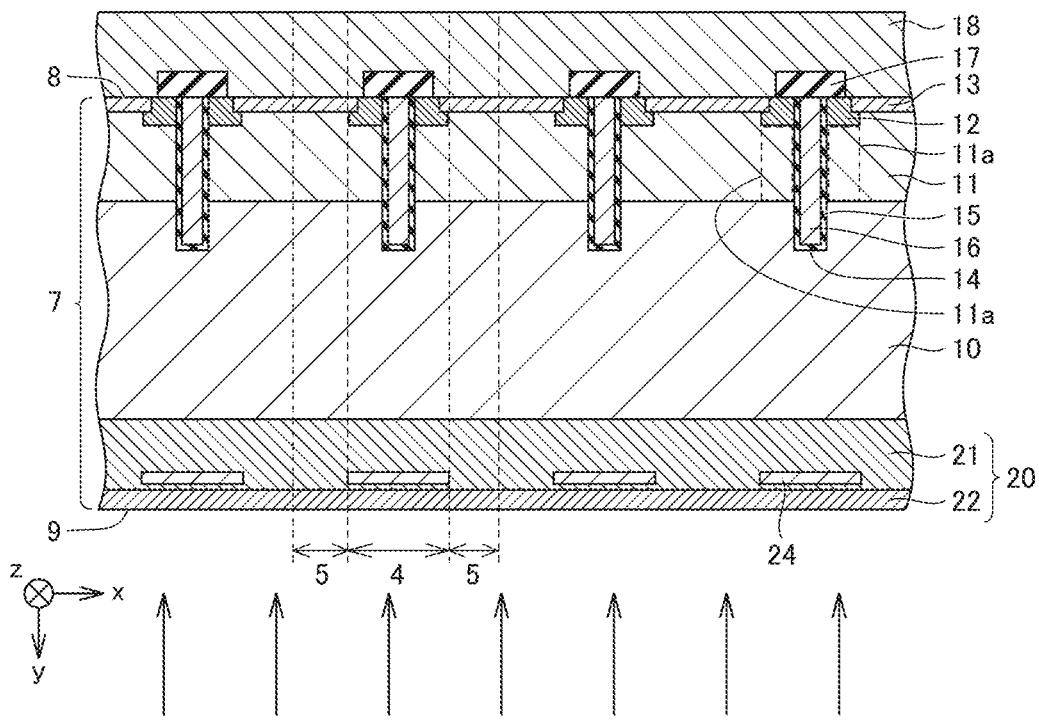
FIG. 11 is a schematic partially-enlarged sectional view showing a step following the step shown in FIG. 10 in the method of manufacturing the semiconductor apparatus according to Embodiment 1.
Figure 12:
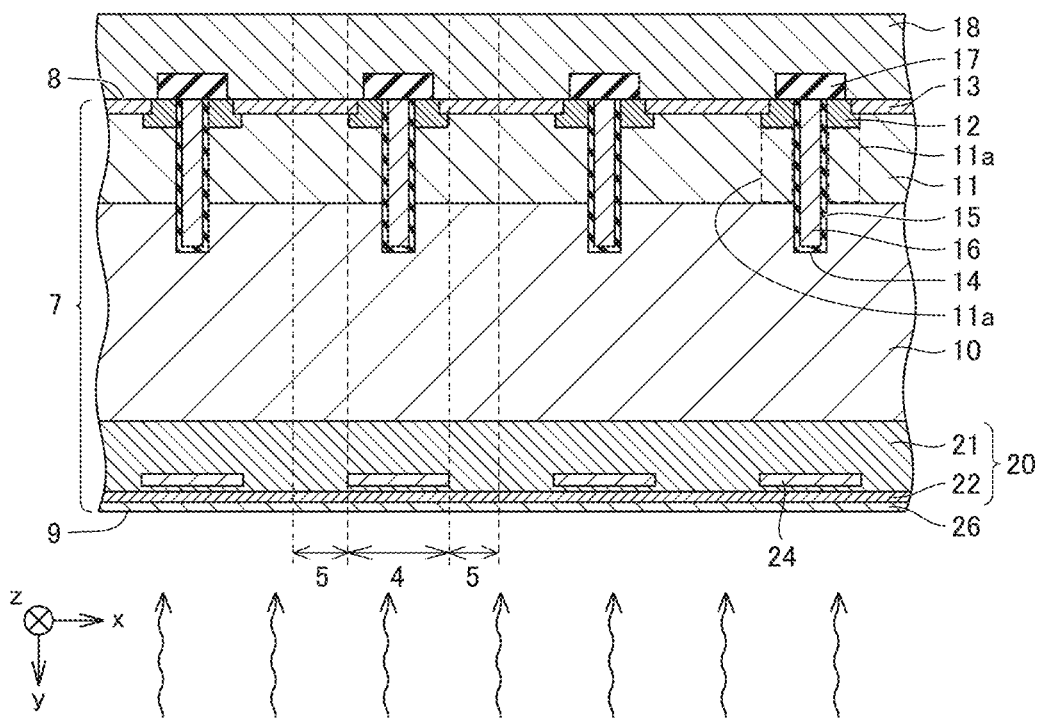
FIG. 12 is a schematic partially-enlarged sectional view showing a step following the step shown in FIG. 11 in the method of manufacturing the semiconductor apparatus according to Embodiment 1.
Figure 13:
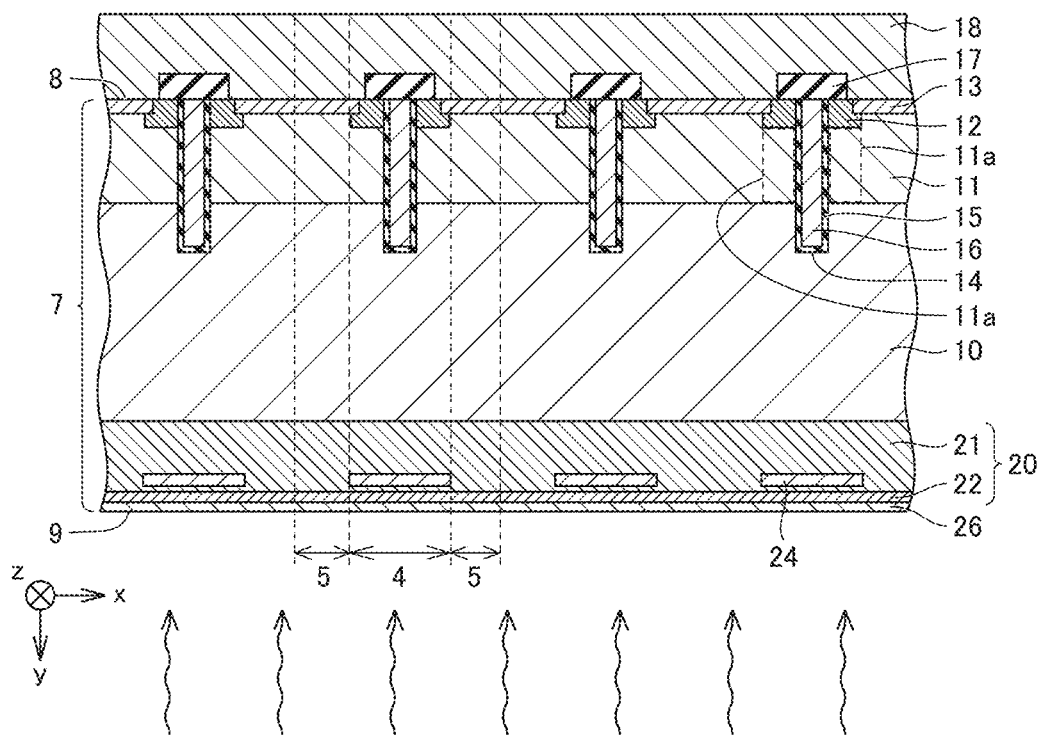
FIG. 13 is a schematic partially-enlarged sectional view showing one step of a method of manufacturing a semiconductor apparatus according to a modification of Embodiment 1.

As shown in FIGS. 11 and 12, the method of manufacturing semiconductor apparatus 1 of the present embodiment includes forming p-type collector layer 26 in rear surface 9 by doping with the second p-type dopant from rear surface 9. First p-type semiconductor region 24 is separated from p-type collector layer 26 and p-type base region 11. The second p-type dopant may be, for example, boron. Specifically, p-type collector layer 26 may be formed by implanting boron into second n-type buffer layer 22 with an ion implanter.

As shown in FIG. 12, in order to activate the second p-type dopant, p-type collector layer 26 may be annealed by heat application to p-type collector layer 26. Specifically, p-type collector layer 26 may be subjected to laser annealing.

The method of manufacturing semiconductor apparatus 1 of the present embodiment includes forming second electrode 29 on p-type collector layer 26. Second electrode 29 is a laminated film of Al/Ti/Ni/Au or a laminated film of AlSi/Ti/Ni/Au. To bring second electrode 29 into ohmic contact with p-type collector layer 26, second electrode 29 and p-type collector layer 26 may be annealed. Specifically, second electrode 29 and p-type collector layer 26 may be annealed at a temperature of, for example, approximately 350° C. Consequently, semiconductor apparatus 1 of the present embodiment shown in FIG. 1 is obtained.

In one example of the method of manufacturing semiconductor apparatus 1 of the present embodiment described above, every time first n-type buffer layer 21, first p-type semiconductor region 24, second n-type buffer layer 22, and p-type collector layer 26 are each formed, the heat treatment for activating a dopant contained in each of first n-type buffer layer 21, first p-type semiconductor region 24, second n-type buffer layer 22, and p-type collector layer 26 is performed. In contrast, in another example of the method of manufacturing semiconductor apparatus 1 of the present embodiment, as shown in 13, first n-type buffer layer 21, first p-type semiconductor region 24, second n-type buffer layer 22, and p-type collector layer 26 may be annealed collectively after the formation of all of first n-type buffer layer 21, first p-type semiconductor region 24, second n-type buffer layer 22, and p-type collector layer 26. In this manner, the first n-type dopant, the second n-type dopant, the first p-type dopant, and the second p-type dopant may be activated collectively.

Figure 14:
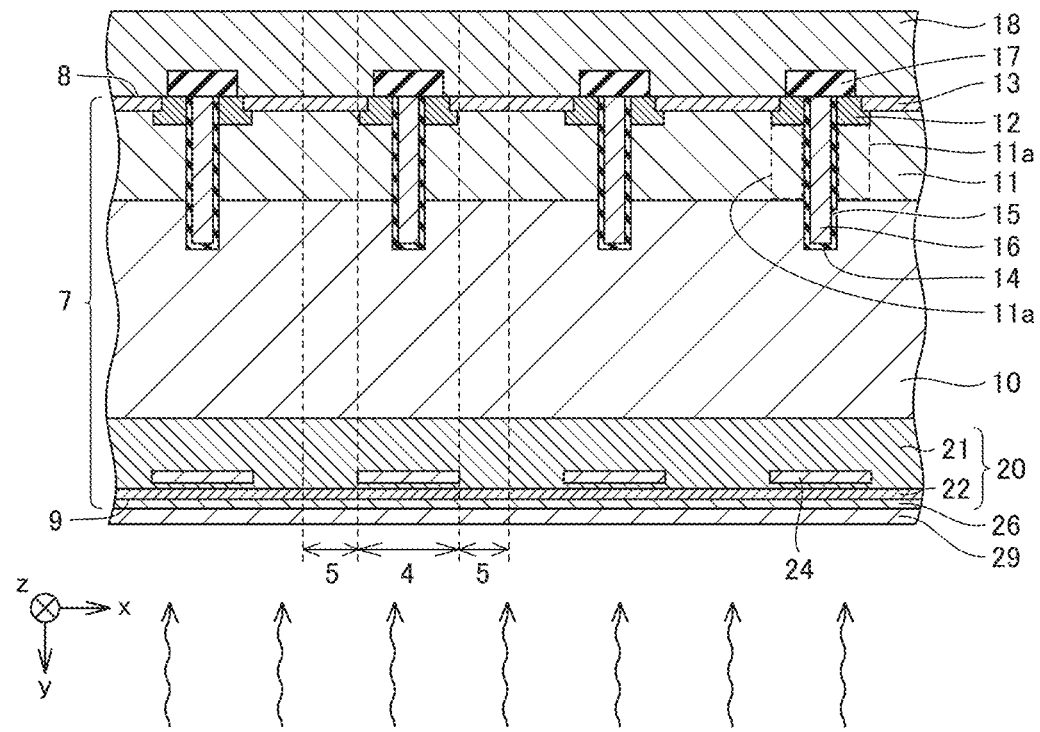
FIG. 14 is a schematic partially-enlarged sectional view showing one step of the method of manufacturing the semiconductor apparatus according to the modification of Embodiment 1.
Figure 15:
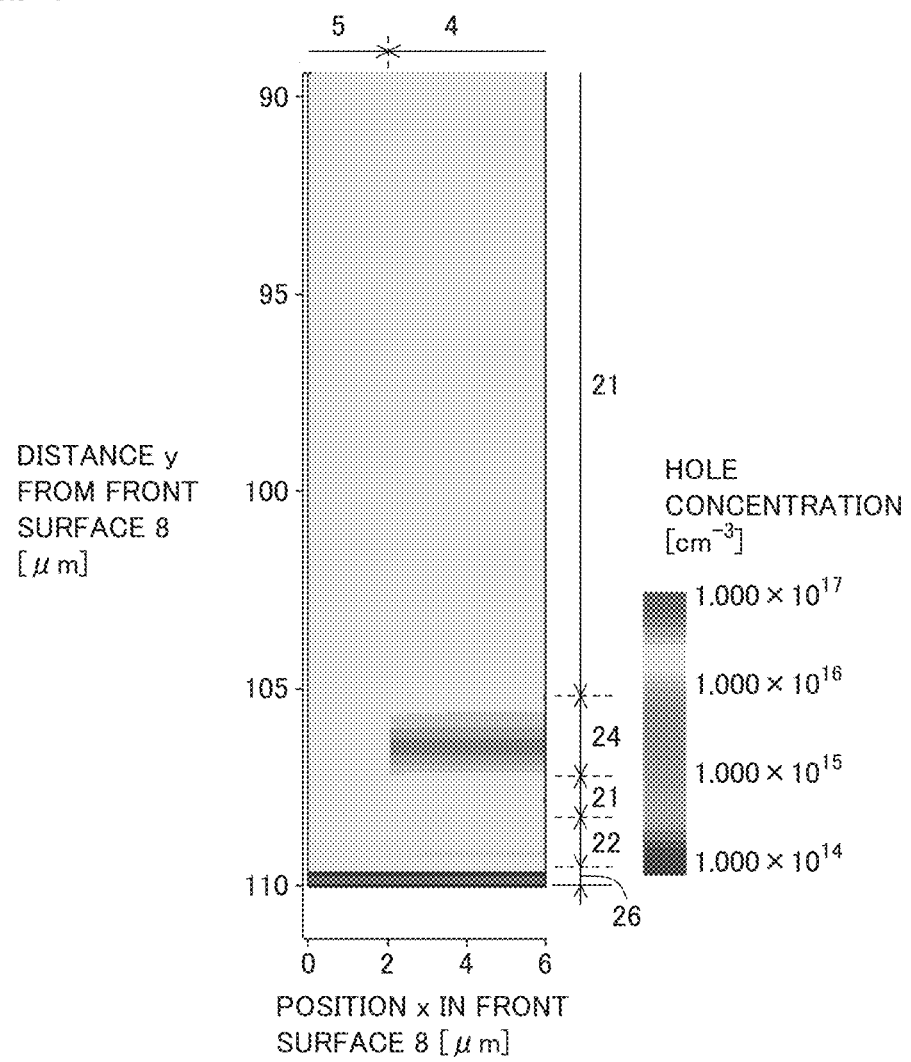
FIG. 15 shows a distribution of a hole concentration in the semiconductor apparatus according to Embodiment 1 when a rated current flows through the semiconductor apparatus according to Embodiment 1.
Figure 16:
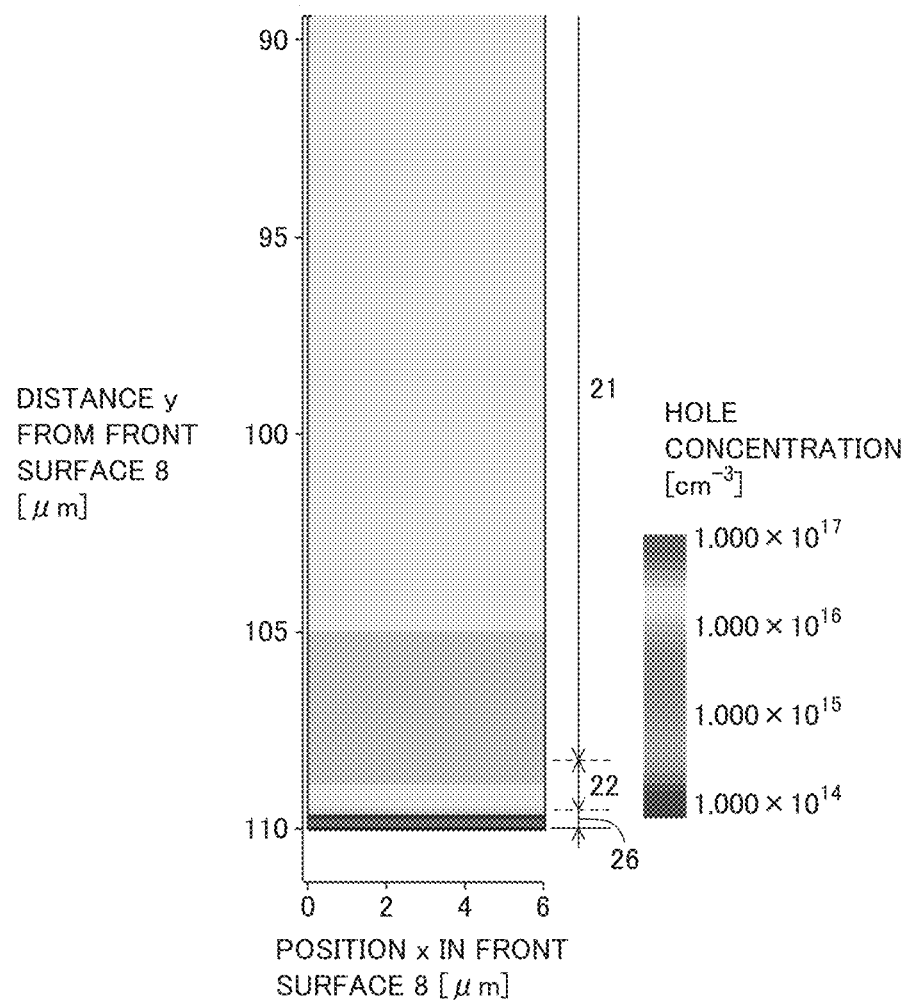
FIG. 16 shows a distribution of a hole concentration in a semiconductor apparatus according to Comparative Example 1 when a rated current flows through the semiconductor apparatus according to Comparative Example 1.
Figure 17:
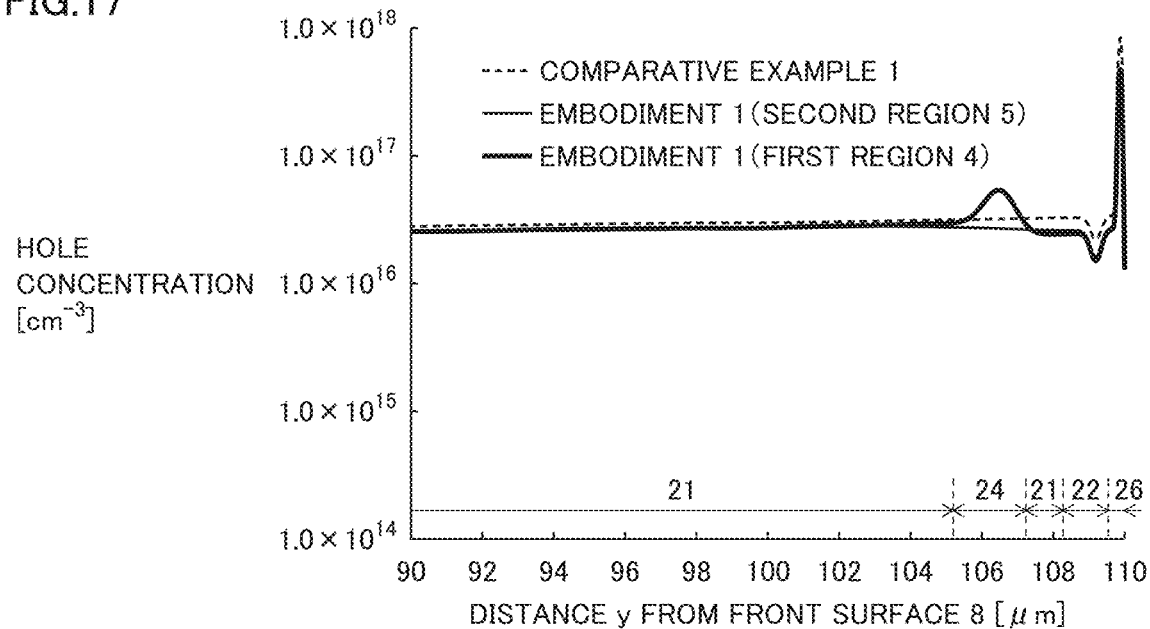
FIG. 17 shows distributions of hole concentrations in the semiconductor apparatus according to Embodiment 1 and Comparative Example 1 when a rated current flows through the semiconductor apparatus according to Embodiment 1 and Comparative Example 1.
Figure 18:
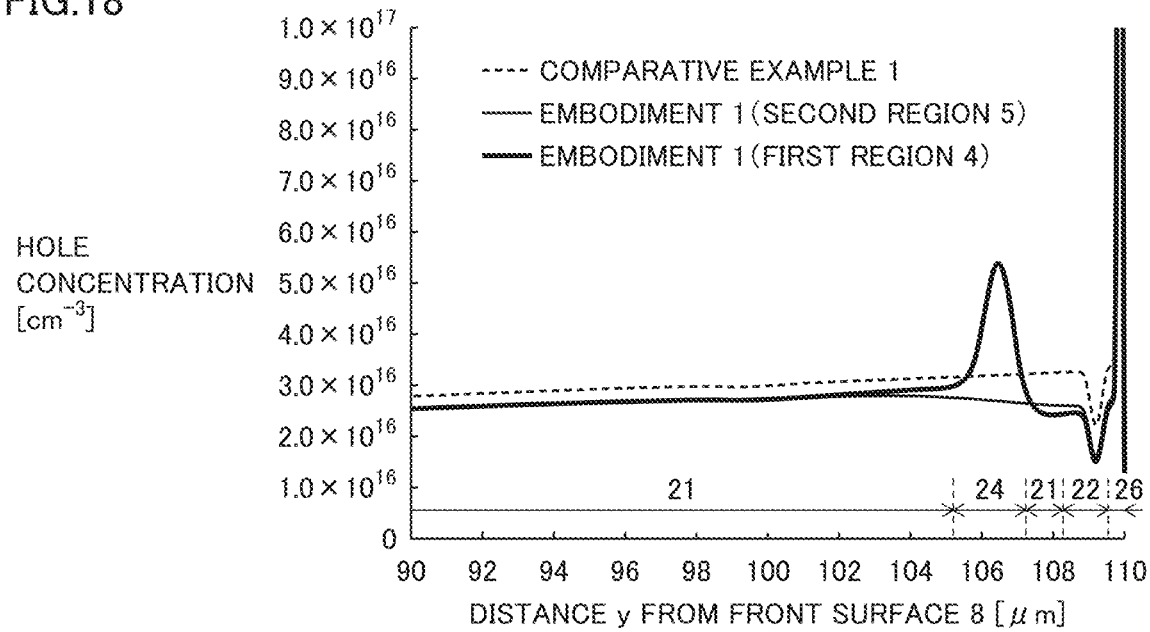
FIG. 18 shows distributions of hole concentrations in the semiconductor apparatus according to Embodiment 1 and Comparative Example 1 when a rated current flows through the semiconductor apparatus according to Embodiment 1 and Comparative Example 1.

As shown in FIG. 14, in still another example of the method of manufacturing semiconductor apparatus 1 of the present embodiment, first n-type buffer layer 21, first p-type semiconductor region 24, second n-type buffer layer 22, p-type collector layer 26, and second electrode 29 may be annealed collectively after the formation of all of first n-type buffer layer 21, first p-type semiconductor region 24, second n-type buffer layer 22, p-type collector layer 26, and second electrode 29. In this manner, activating the first n-type dopant, the second n-type dopant, the first p-type dopant, and the second p-type dopant and bringing second electrode 29 into ohmic contact with p-type collector layer 26 can be performed in a single step.

In one example of the method of manufacturing semiconductor apparatus 1 of the present embodiment described above, first n-type buffer layer 21, first p-type semiconductor region 24, second n-type buffer layer 22, and p-type collector layer 26 are formed in the stated order. In contrast, in still another example of the method of manufacturing semiconductor apparatus 1 of the present embodiment, first n-type buffer layer 21, first p-type semiconductor region 24, second n-type buffer layer 22, and p-type collector layer 26 may be formed in an order different from that of one example of the method of manufacturing semiconductor apparatus 1 according to the present embodiment. It should be noted that the method of manufacturing semiconductor apparatus 1a (see FIG. 26) of the modification of the present embodiment includes steps similar to those of the method of manufacturing semiconductor apparatus 1 of the present embodiment except in that it includes a step of forming gate insulating film 15 and gate electrode 16 on front surface 8 of semiconductor substrate 7.

The operation of semiconductor apparatus 1 of the present embodiment will be described in comparison with the semiconductor apparatus of Comparative Example 1. The semiconductor apparatus of Comparative Example 1 includes components similar to those of semiconductor apparatus 1 of the present embodiment but differs from semiconductor apparatus 1 in that first p-type semiconductor region 24 is omitted.

A first voltage higher than a threshold voltage is applied to gate electrode 16, and a third voltage higher than a second voltage applied to first electrode 18 is applied to second electrode 29. The application of the first voltage to gate electrode 16 forms a channel in portion 11a of p-type base region 11. Electrons are injected into n-type drift region 10 and first n-type buffer layer 21 from n-type emitter region 12, and holes are injected thereto from p-type collector layer 26. Electrons and holes are accumulated in n-type drift region 10 and first n-type buffer layer 21. A conductivity modulation occurs in n-type drift region 10 and first n-type buffer layer 21, significantly reducing the resistances of n-type drift region 10 and first n-type buffer layer 21. Consequently, semiconductor apparatus 1 (semiconductor device 3) enters ON-state. A rated current flows through semiconductor apparatus 1 (semiconductor device 3), and semiconductor apparatus 1 (semiconductor device 3) has a low ON-state voltage $V_{CE}(sat)$. ON-state voltage $V_{CE}(sat)$ is a saturation voltage across first electrode 18 and second electrode 29 in ON-state of semiconductor apparatus 1.

As shown in FIGS. 15 to 18, while a rated current flows through the semiconductor apparatus (semiconductor apparatus 1 of the present embodiment, the semiconductor apparatus of Comparative Example 1), the hole concentrations in n-type drift region 10 and first n-type buffer layer 21 included in semiconductor apparatus 1 of the present embodiment are almost equal to the hole concentrations in n-type drift region 10 and first n-type buffer layer 21 included in the semiconductor apparatus of Comparative Example 1. For example, in a portion of first n-type buffer layer 21 with a distance y of 100 μm from front surface 8, first region 4 of the present embodiment, second region 5 of the present embodiment, and Comparative Example 1 respectively have hole concentrations of $2.72 \times 10^{16}$ cm$^{-3}$, $2.71 \times 10^{16}$ cm$^{-3}$, and $2.99 \times 10^{16}$ cm$^{-3}$. Semiconductor apparatus 1 of the present embodiment and the semiconductor apparatus of Comparative Example 1 have a substantially equal ON-state voltage $V_{CE}(sat)$.

Figure 19:
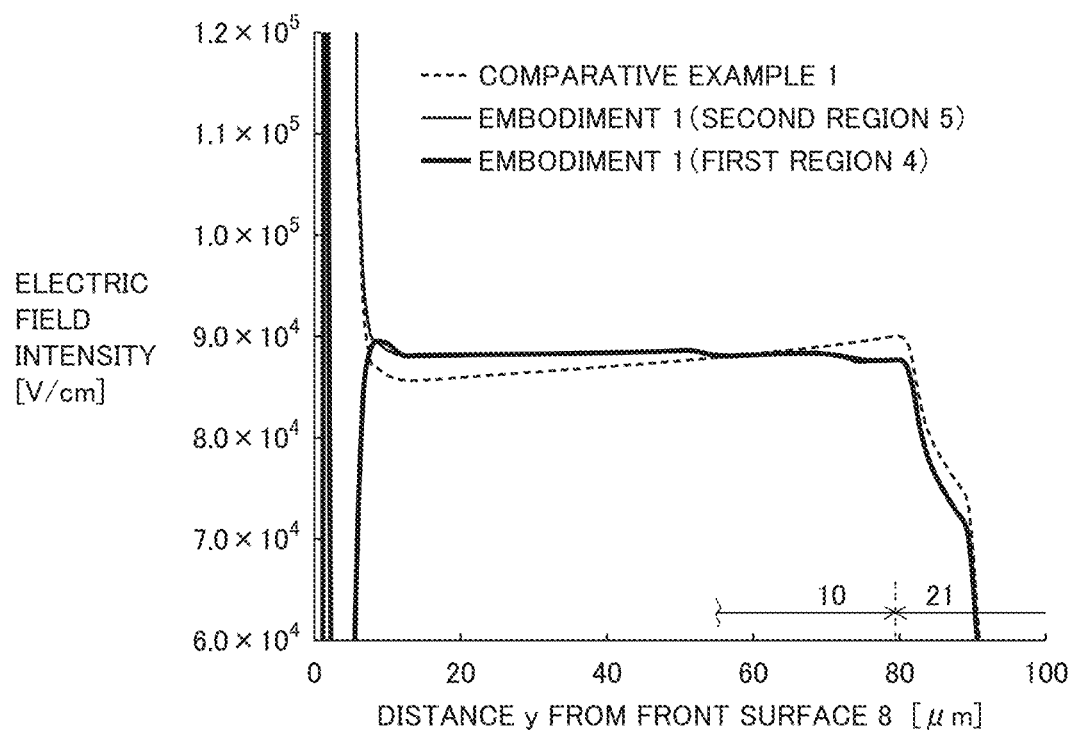
FIG. 19 shows distributions of electric field intensities in the semiconductor apparatus according to Embodiment 1 and Comparative Example 1 in load short circuit.
Figure 20:
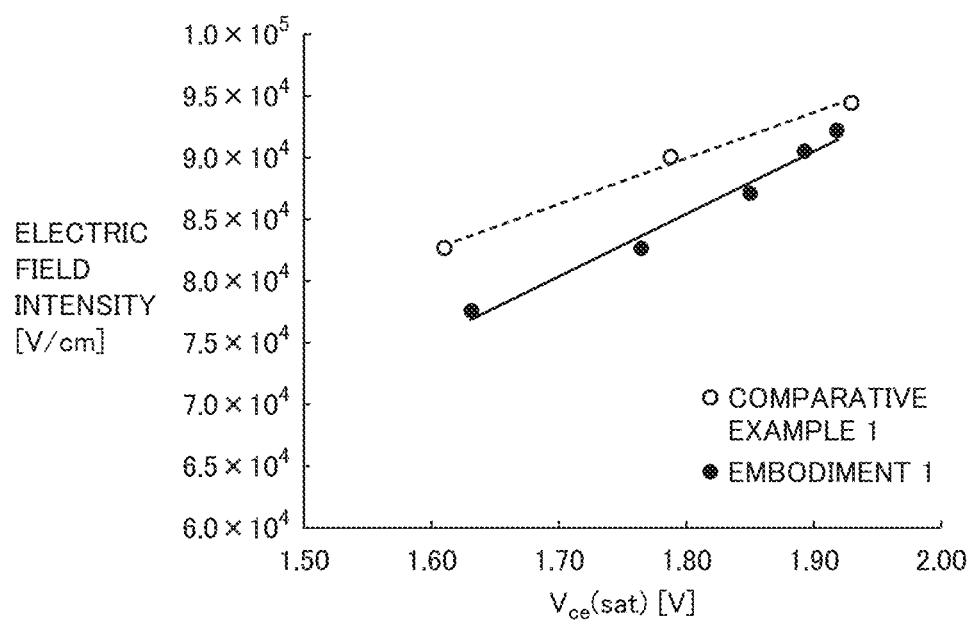
FIG. 20 shows relationships between ON-state voltages ($V_{CE}$(sat)) of the semiconductor apparatus according to Embodiment 1 and Comparative Example 1 and electric field intensities of the semiconductor apparatus according to Embodiment 1 and Comparative Example 1 in a portion of a first n-type buffer layer with a distance of 80 μm from a front surface, in load short circuit.

In contrast, when a load (e.g., motor) connected to the semiconductor apparatus (semiconductor apparatus 1 of the present embodiment, the semiconductor apparatus of Comparative Example 1) shorts out, a power supply voltage is applied to the semiconductor apparatus (semiconductor apparatus 1 of the present embodiment, the semiconductor apparatus of Comparative Example 1). When the semiconductor apparatus (semiconductor device 3) of Comparative Example 1 enters ON state in the load short circuit, a power supply voltage is applied across first electrode 18 and second electrode 29, and a larger amount of current than the rated current flows between first electrode 18 and second electrode 29. Since many electrons are injected into n-type drift region 10 from n-type emitter region 12, a depletion layer spreads from a boundary region between p-type base region 11 and n-type drift region 10 to a boundary region between n-type drift region 10 and first n-type buffer layer 21. Space charges (e.g., donor charges) contained in n-type drift region 10 are canceled by the electrons injected from n-type emitter region 12. This reduces an electric field in the portion of the n-type drift region 10 adjacent to p-type base region 11 and, as shown in FIGS. 19 and 20, increases the electric field intensity (rear-surface electric field intensity) in the boundary region between n-type drift region 10 and first n-type buffer layer 21.

Figure 22:
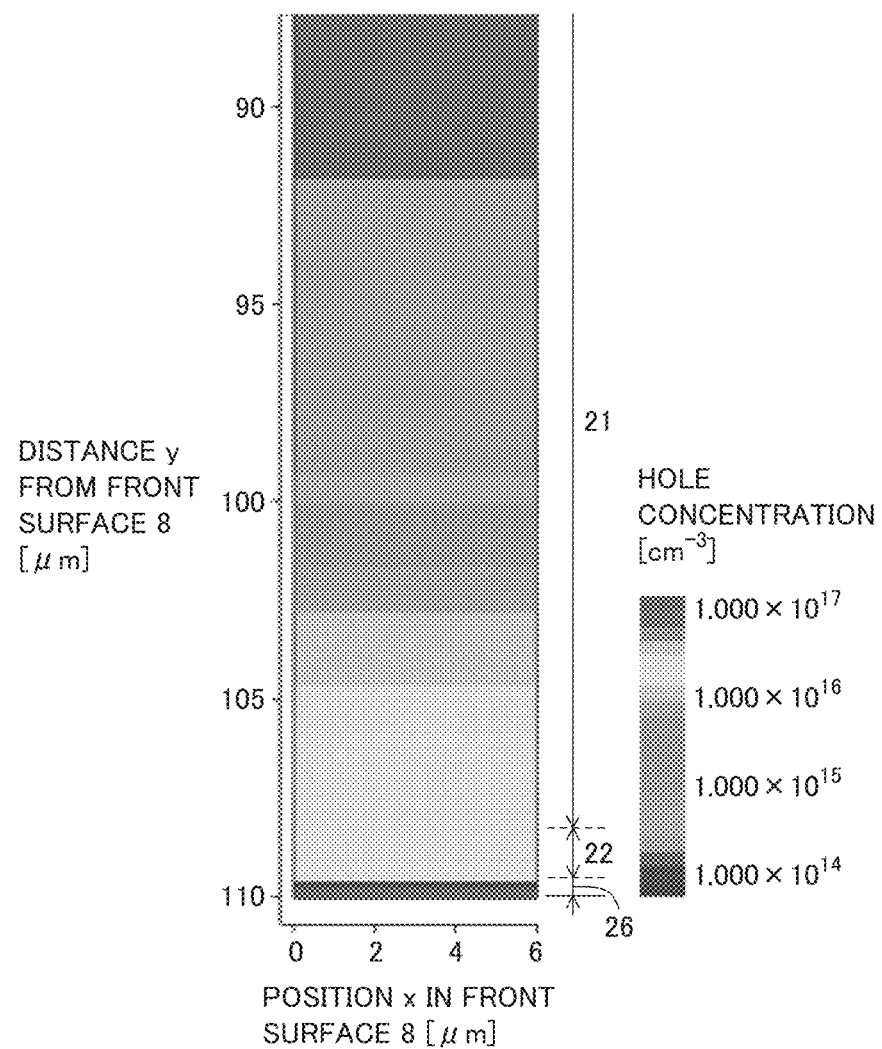
FIG. 22 shows a distribution of a hole concentration in the semiconductor apparatus according to Comparative Example 1 in load short circuit.
Figure 23:
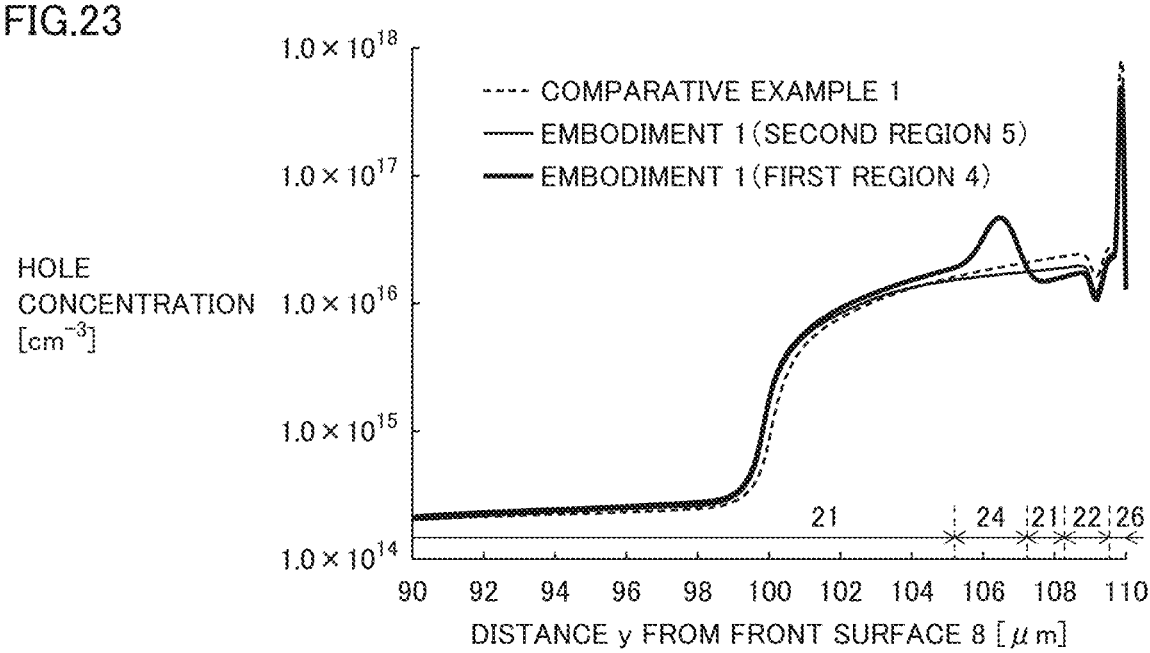
FIG. 23 shows distributions of hole concentrations in the semiconductor apparatus according to Embodiment 1 and Comparative Example 1 in load short circuit.
Figure 24:
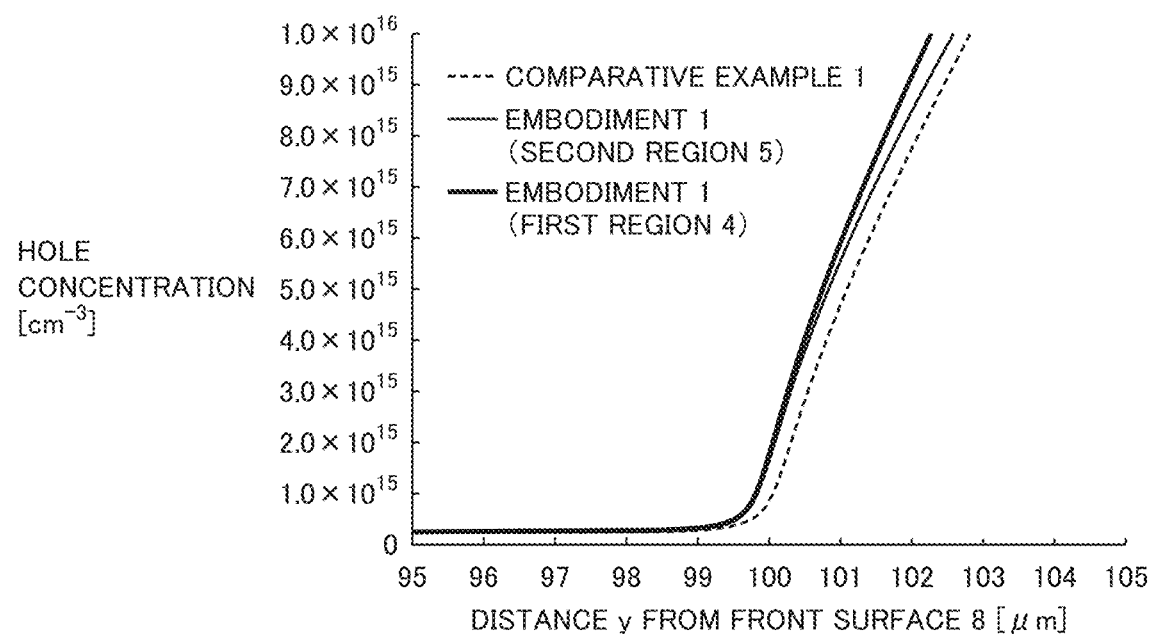
FIG. 24 shows distributions of hole concentrations of the semiconductor apparatus according to Embodiment 1 and Comparative Example 1 in load short circuit.

The increased electric field intensity (rear-surface electric field intensity) in the boundary region between n-type drift region 10 and first n-type buffer layer 21 significantly increases an amount of holes that drift from n-type drift region 10 and first n-type buffer layer 21 toward n-type emitter region 12. This significantly reduces the hole concentrations in n-type drift region 10 and first n-type buffer layer 21, as shown in FIGS. 22 to 24. The hole concentrations in n-type drift region 10 and first n-type buffer layer 21 become much lower than the electron concentrations in n-type drift region 10 and first n-type buffer layer 21. For example, in Comparative Example 1, the hole concentration in the portion of first n-type buffer layer 21 with a distance y of 100 μm from front surface 8 has been decreased to $8.75 \times 10^{14}$ cm$^{-3}$.

In the semiconductor apparatus of Comparative Example 1, a high electric field (rear-surface electric field) continues to be applied to the boundary region between n-type drift region 10 and first n-type buffer layer 21 in load short circuit. This results in a short time to breakdown of the semiconductor apparatus of Comparative Example 1. The semiconductor apparatus of Comparative Example 1 has a low short circuit capacity in load short circuit.

In contrast, semiconductor apparatus 1 of the present embodiment includes first p-type semiconductor region 24 inside first n-type buffer layer 21. First p-type semiconductor region 24 increases the amount of holes to be injected from p-type collector layer 26 into first n-type buffer layer 21 and n-type drift region 10 and also reduces cancel-out of space charges (e.g., donor charges) in n-type drift region 10 by the electrons injected from n-type emitter region 12. As shown in FIGS. 19 and 20, first p-type semiconductor region 24 decreases the electric field intensity (rear-surface electric field intensity) in the boundary region between n-type drift region 10 and first n-type buffer layer 21.

Figure 21:
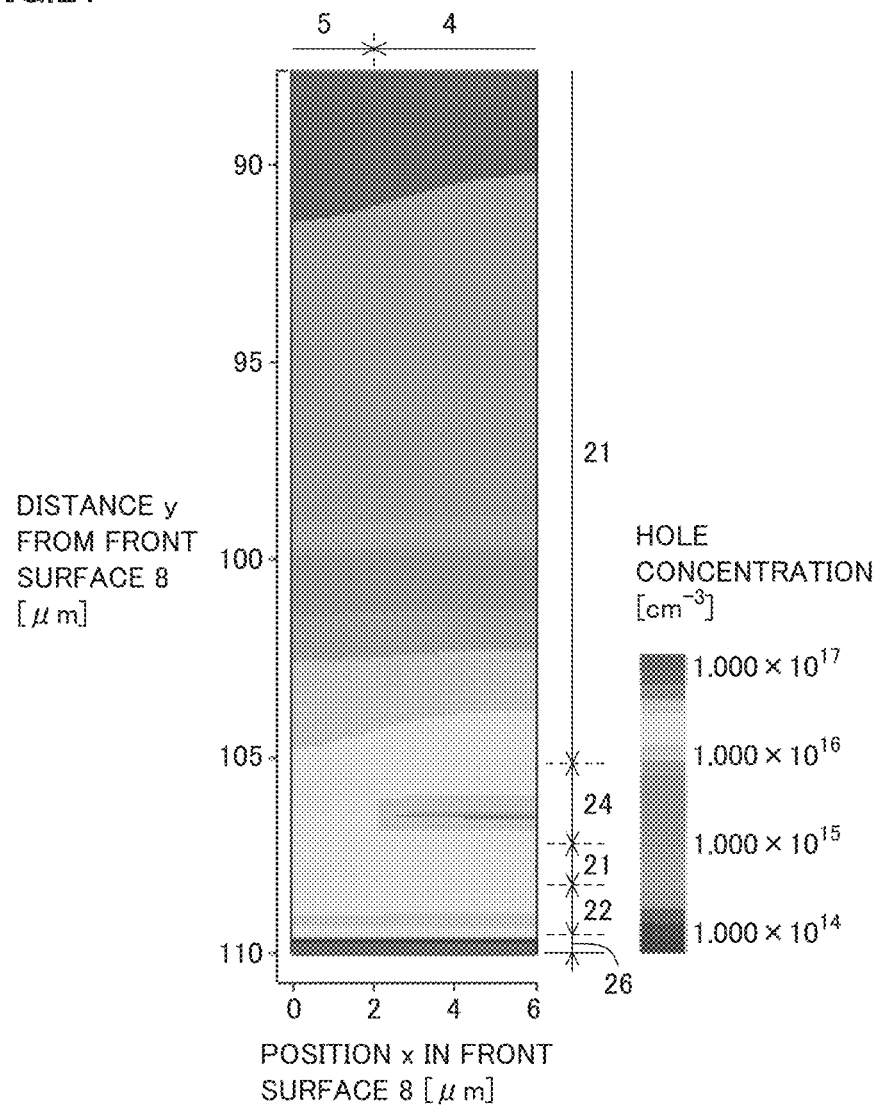
FIG. 21 shows a distribution of a hole concentration in the semiconductor apparatus according to Embodiment 1 in load short circuit.

Since the electric field intensity (rear-surface electric field intensity) in the boundary region between n-type drift region 10 and first n-type buffer layer 21 decreases, the amount of holes that drift from n-type drift region 10 and first n-type buffer layer 21 toward n-type emitter region 12 decreases. As shown in FIGS. 21, 23, and 24, thus, first p-type semiconductor region 24 suppresses decreases in the hole concentrations in n-type drift region 10 and first n-type buffer layer 21 in load short circuit. In load short circuit, first p-type semiconductor region 24 suppresses a decrease in hole concentration not only in n-type drift region 10 and first n-type buffer layer 21 in first region 4 but also in n-type drift region 10 and first n-type buffer layer 21 in second region 5. For example, in the portion of first n-type buffer layer 21 with a distance y of 100 μm from front surface 8, first region 4 and second region 5 of the present embodiment respectively have hole concentrations of $1.80 \times 10^{15}$ cm$^{-3}$ and $1.68 \times 10^{15}$ cm$^{-3}$.

In load short circuit, first p-type semiconductor region 24 can reduce an electric field (rear-surface electric field) continued to be applied to the boundary region between n-type drift region 10 and first n-type buffer layer 21. Semiconductor apparatus 1 of the present embodiment can thus increase a time to breakdown of semiconductor apparatus 1. Semiconductor apparatus 1 of the present embodiment can improve the short circuit capacity in load short circuit.

In FIG. 20, ON-state voltage $V_{CE}(sat)$ of semiconductor apparatus 1 of the present embodiment is varied by varying the concentration of the first p-type carriers (holes) contained in first p-type semiconductor region 24. In FIG. 20, ON-state voltage $V_{CE}(sat)$ of the semiconductor apparatus of Comparative Example 1 is varied by varying the concentration of the second p-type carriers (holes) contained in p-type collector layer 26. With a higher concentration of the first p-type carriers or a higher concentration of the second p-type carriers, ON-state voltage $V_{CE}(sat)$ of the semiconductor apparatus (semiconductor apparatus 1 of the present embodiment, the semiconductor apparatus of Comparative Example 1) decreases.

Figure 25:
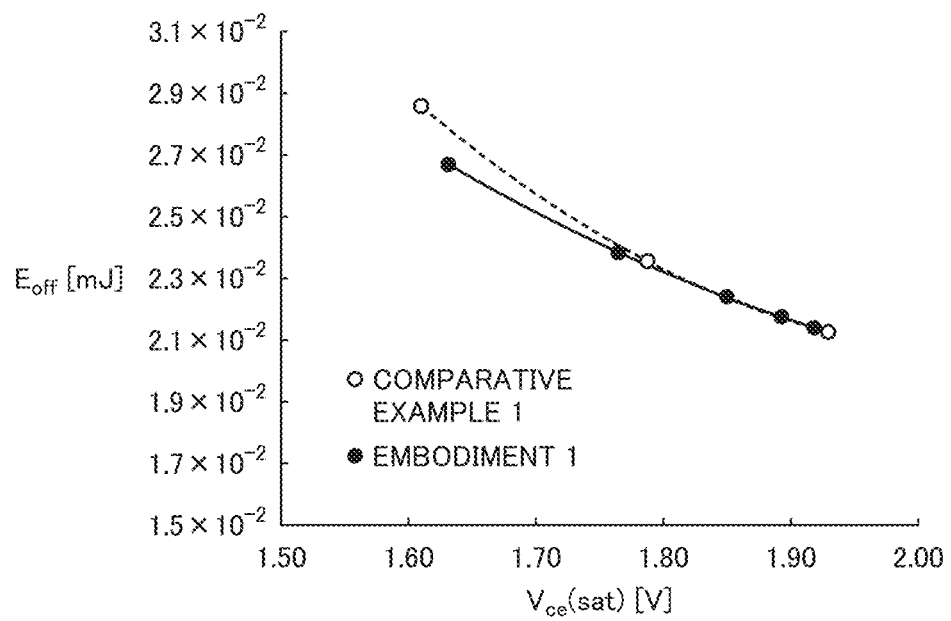
FIG. 25 shows relationships between ON-state voltages ($V_{CE}$(sat)) and turn-off power losses $E_{off}$ of the semiconductor apparatus according to Embodiment 1 and Comparative Example 1.

As shown in FIG. 25, in the semiconductor apparatus (semiconductor apparatus 1 of the present embodiment, the semiconductor apparatus of Comparative Example 1) such as an IGBT, ON-state voltage $V_{CE}(sat)$ and turn-off power loss $E_{off}$ have a trade-off relationship. Turn-off power loss $E_{off}$ is an electric power loss occurring in the semiconductor apparatus in a turn-off process. The turn-off process is a process in which a semiconductor apparatus shifts from ON state to OFF state. The ON-state voltage $V_{CE}(sat)$-turn-off power loss $E_{off}$ characteristics of semiconductor apparatus 1 of the present embodiment have been improved more than the ON-state voltage $V_{CE}(sat)$-turn-off power loss $E_{off}$ characteristics of the semiconductor apparatus of Comparative Example 1.

When the semiconductor apparatus (semiconductor apparatus 1 of the present embodiment, the semiconductor apparatus of Comparative Example 1) is designed such that the electric field intensity (rear-surface electric field intensity) is smaller than or equal to an allowable electric field intensity corresponding to an allowable short circuit capacity, as shown in FIG. 20, ON-state voltage $V_{CE}(\text{sat})$ of semiconductor apparatus 1 of the present embodiment can be made higher than ON-state voltage $V_{CE}(\text{sat})$ of the semiconductor apparatus of Comparative Example 1. Consequently, as shown in FIG. 25, semiconductor apparatus 1 of the present embodiment can reduce turn-off power loss $E_{off}$ more than the semiconductor apparatus of Comparative Example 1. It should be noted that semiconductor apparatus 1a of the modification of the present embodiment operates similarly to semiconductor apparatus 1 of the present embodiment.

The effects of semiconductor apparatus 1, 1a and the method of manufacturing the same according to the present embodiment will be described.

Semiconductor apparatus 1, 1a of the present embodiment includes semiconductor substrate 7 including cell region 2 in which semiconductor device 3 is provided. Semiconductor substrate 7 has front surface 8 and rear surface 9. Semiconductor device 3 includes n-type drift region 10, p-type base region 11, n-type emitter region 12, gate insulating film 15, gate electrode 16, and p-type collector layer 26 provided in rear surface 9. Gate insulating film 15 is provided on portion 11a of p-type base region 11 sandwiched between n-type emitter region 12 and n-type drift region 10. Gate electrode 16 faces portion 11a of p-type base region 11 with gate insulating film 15 between gate electrode 16 and portion 11a.

Semiconductor device 3 includes first n-type buffer layer 21, second n-type buffer layer 22, and first p-type semiconductor region 24. First n-type buffer layer 21 is in contact with n-type drift region 10 and is provided on a rear surface 9 side with respect to n-type drift region 10. Second n-type buffer layer 22 is in contact with first n-type buffer layer 21 and is provided on a rear surface 9 side with respect to first n-type buffer layer 21. The first maximum peak concentration of the first n-type carriers contained in first n-type buffer layer 21 is lower than the second maximum peak concentration of the second n-type carriers contained in second n-type buffer layer 22. First n-type buffer layer 21 is thicker than second n-type buffer layer 22. First p-type semiconductor region 24 is formed inside first n-type buffer layer 21. First p-type semiconductor region 24 has a narrower width than first n-type buffer layer 21 in the direction (first direction, or x direction) in which n-type emitter region 12 and gate electrode 16 are arranged. First p-type semiconductor region 24 is spaced away from p-type collector layer 26 and p-type base region 11.

Semiconductor apparatus 1, 1a of the present embodiment includes first p-type semiconductor region 24 inside first n-type buffer layer 21. In load short circuit, first p-type semiconductor region 24 suppresses decreases in the hole concentrations in n-type drift region 10 and first n-type buffer layer 21 and reduces the electric field intensity (rear-surface electric field intensity) in the boundary region between n-type drift region 10 and first n-type buffer layer 21. Semiconductor apparatus 1, 1a of the present embodiment can improve the short circuit capacity in load short circuit.

First p-type semiconductor region 24 is formed inside first n-type buffer layer 21 rather than inside second n-type buffer layer 22. A carrier concentration difference between first p-type semiconductor region 24 and the buffer layer inside which first p-type semiconductor region 24 is formed can be made greater when first p-type semiconductor region 24 is formed inside first n-type buffer layer 21 than when first p-type semiconductor region 24 is formed inside second n-type buffer layer 22. First p-type semiconductor region 24 formed inside first n-type buffer layer 21 thus effectively suppresses decreases in the hole concentrations in n-type drift region 10 and first n-type buffer layer 21 in load short circuit and also effectively reduces the electric field intensity (rear-surface electric field intensity) in the boundary region between n-type drift region 10 and first n-type buffer layer 21. First p-type semiconductor region 24 can also be disposed closer to the boundary region between n-type drift region 10 and first n-type buffer layer 21 where electric field intensity (rear-surface electric field intensity) is the greatest in load short circuit. Thus, semiconductor apparatus 1, 1a of the present embodiment can effectively improve the short circuit capacity in load short circuit.

Semiconductor apparatus 1, 1a of the present embodiment includes second n-type buffer layer 22. Even when semiconductor substrate 7 is thinned for a reduced ON-state voltage $V_{CE}(\text{sat})$ of semiconductor apparatus 1, 1a (e.g., see FIG. 4), second n-type buffer layer 22 can prevent the depletion layer formed between p-type base region 11 and n-type drift region 10 in ON state of semiconductor apparatus 1, 1a from reaching rear surface 9 of semiconductor substrate 7. Semiconductor apparatus 1, 1a of the present embodiment can reduce ON-state voltage $V_{CE}(\text{sat})$ of semiconductor apparatus 1, 1a and also prevent the generation of a leak current in semiconductor apparatus 1, 1a and a decrease in the breakdown voltage of semiconductor apparatus 1, 1a.

In the turn-off process, upon application of a surge voltage across first electrode 18 and second electrode 29, the depletion layer formed between p-type base region 11 and n-type drift region 10 spreads toward rear surface 9 of semiconductor substrate 7. In semiconductor apparatus 1, 1a of the present embodiment, n-type drift region 10 is in contact with first n-type buffer layer 21 having a maximum peak concentration of the n-type carriers which is lower than that of the second n-type buffer layer 22. This reduces a carrier concentration difference between n-type drift region 10 and the buffer layer in contact with n-type drift region 10. First n-type buffer layer 21 in contact with n-type drift region 10 can gently stop spreading of the depletion layer. The depletion of electrons and holes is prevented in n-type drift region 10 and first n-type buffer layer 21. Semiconductor apparatus 1, 1a of the present embodiment can suppress oscillations of the voltage across first electrode 18 and second electrode 29 after the application of a surge voltage to semiconductor apparatus 1, 1a.

In semiconductor apparatus 1, 1a of the present embodiment, first p-type semiconductor region 24 has a narrower width than first n-type buffer layer 21 in the direction in which n-type emitter region 12 and gate electrode 16 are arranged (first direction, or x direction). Electrons injected from n-type emitter region 12 can bypass first p-type semiconductor region 24 and flow into p-type collector layer 26. Semiconductor apparatus 1, 1a of the present embodiment can prevent the occurrence of a snap-back phenomenon in current-ON-state voltage ($V_{CE}(\text{sat})$) characteristics of semiconductor apparatus 1, 1a.

First p-type semiconductor region 24 can improve the ON-state voltage $V_{CE}(\text{sat})$-turn-off power loss $E_{off}$ characteristics of semiconductor apparatus 1, 1a. Semiconductor apparatus 1, 1a of the present embodiment can reduce turn-off power loss $E_{off}$.

In semiconductor apparatus 1, 1a of the present embodiment, first p-type semiconductor region 24 may overlap gate electrode 16 in the plan view of front surface 8. In operation of semiconductor apparatus 1, 1a, a larger number of electrons are injected from n-type emitter region 12 into a region (e.g., first region 4) of semiconductor substrate 7 which overlaps gate electrode 16 than into a region (e.g., second region 5) of semiconductor substrate 7 which does not overlap gate electrode 16. First p-type semiconductor region 24 is disposed so as to overlap gate electrode 16 in the plan view of front surface 8. This can further suppresses decreases in the hole concentrations in n-type drift region 10 and first n-type buffer layer 21 in load short circuit and can also further reduce the electric field intensity (rear-surface electric field intensity) in the boundary region between n-type drift region 10 and first n-type buffer layer 21. Semiconductor apparatus 1, 1a of the present embodiment can improve the short circuit capacity in load short circuit.

In semiconductor apparatus 1, 1a of the present embodiment, the third maximum peak concentration of the first p-type carriers contained in first p-type semiconductor region 24 may be higher than the second maximum peak concentration of the second n-type carriers contained in second n-type buffer layer 22. This can further suppress decreases in the hole concentrations in n-type drift region 10 and first n-type buffer layer 21 in load short circuit and can also further reduce the electric field intensity (rear-surface electric field intensity) in the boundary region between n-type drift region 10 and first n-type buffer layer 21. Semiconductor apparatus 1, 1a of the present embodiment can improve the short circuit capacity in load short circuit.

In semiconductor apparatus 1, 1a of the present embodiment, first p-type semiconductor region 24 may be thicker than p-type collector layer 26. This can further suppress a decrease in hole concentrations in n-type drift region 10 and first n-type buffer layer 21 in load short circuit and can further reduce the electric field intensity (rear-surface electric field intensity) in the boundary region between n-type drift region 10 and first n-type buffer layer 21. Semiconductor apparatus 1, 1a of the present embodiment can improve the short circuit capacity in load short circuit.

In semiconductor apparatus 1, 1a of the present embodiment, first n-type buffer layer 21 may have a plurality of peak concentrations of the first n-type carriers. The plurality of peak concentrations may decrease with an increasing distance from rear surface 9. First n-type buffer layer 21 can gently stop spreading of a depletion layer which occurs in the turn-off process. Semiconductor apparatus 1, 1a of the present embodiment can suppress oscillations of a voltage across first electrode 18 and second electrode 29 after the application of a surge voltage to semiconductor apparatus 1, 1a in the turn-off process.

In semiconductor apparatus 1, 1a of the present embodiment, the first n-type buffer layer may contain protons. The second n-type buffer layer may contain phosphorus or arsenic. Semiconductor apparatus 1, 1a of the present embodiment can improve the short circuit capacity in load short circuit.

The method of manufacturing semiconductor apparatus 1, 1a of the present embodiment includes preparing semiconductor substrate 7. Semiconductor substrate 7 has front surface 8 and rear surface 9. Semiconductor substrate 7 includes n-type drift region 10, p-type base region 11, n-type emitter region 12, gate insulating film 15, and gate electrode 16. Gate insulating film 15 is provided on portion 11a of p-type base region 11 sandwiched between n-type emitter region 12 and n-type drift region 10. Gate electrode 16 faces portion 11a of p-type base region 11 with gate insulating film 15 between gate electrode 16 and portion 11a.

The method of manufacturing semiconductor apparatus 1, 1a of the present embodiment further includes forming first n-type buffer layer 21 by doping with the first n-type dopant from rear surface 9. First n-type buffer layer 21 is in contact with n-type drift region 10 and is provided on a rear surface 9 side with respect to n-type drift region 10. The method of manufacturing semiconductor apparatus 1, 1a of the present embodiment further includes forming first p-type semiconductor region 24 inside first n-type buffer layer 21 by doping with the first p-type dopant from rear surface 9. First p-type semiconductor region 24 has a narrower width than first n-type buffer layer 21 in the direction in which n-type emitter region 12 and gate electrode 16 are arranged.

The method of manufacturing semiconductor apparatus 1, 1a of the present embodiment further includes forming second n-type buffer layer 22 by doping with the second n-type dopant from rear surface 9. Second n-type buffer layer 22 is in contact with first n-type buffer layer 21 and is provided on a rear surface 9 side with respect to first n-type buffer layer 21. The first maximum peak concentration of the first n-type carriers contained in first n-type buffer layer 21 is lower than the second maximum peak concentration of the second n-type carriers contained in second n-type buffer layer 22. First n-type buffer layer 21 is thicker than second n-type buffer layer 22. The method of manufacturing semiconductor apparatus 1, 1a of the present embodiment further includes forming p-type collector layer 26 in rear surface 9 by doping with the second p-type dopant from rear surface 9. First p-type semiconductor region 24 is spaced away from p-type collector layer 26 and p-type base region 11.

In load short circuit, first p-type semiconductor region 24 suppresses decreases in the hole concentrations in n-type drift region 10 and first n-type buffer layer 21 and also reduces the electric field intensity (rear-surface electric field intensity) in the boundary region between n-type drift region 10 and first n-type buffer layer 21. The method of manufacturing semiconductor apparatus 1, 1a of the present embodiment can improve the short circuit capacity in load short circuit.

Semiconductor apparatus 1, 1a manufactured by the method of manufacturing semiconductor apparatus 1, 1a of the present embodiment includes second n-type buffer layer 22. This can reduce ON-state voltage $V_{CE}(sat)$ of semiconductor apparatus 1, 1a and can also prevent the generation of a leak current in semiconductor apparatus 1, 1a and a decrease in the breakdown voltage of semiconductor apparatus 1, 1a. Semiconductor apparatus 1, 1a manufactured by the method of manufacturing semiconductor apparatus 1, 1a of the present embodiment includes first n-type buffer layer 21. This can prevent oscillations of a voltage across first electrode 18 and second electrode 29 after the application of a surge voltage to semiconductor apparatus 1, 1a.

In semiconductor apparatus 1, 1a manufactured by the method of manufacturing semiconductor apparatus 1, 1a of the present embodiment, first p-type semiconductor region 24 has a narrower width than first n-type buffer layer 21 in the direction in which n-type emitter region 12 and gate electrode 16 are arranged (first direction, or x direction). The method of manufacturing semiconductor apparatus 1, 1a of the present embodiment can prevent the occurrence of a snap-back phenomenon in current-ON-state voltage ($V_{CE}(sat)$) characteristics of semiconductor apparatus 1, 1a.

First p-type semiconductor region 24 can improve the ON-state voltage $V_{CE}(sat)$-turn-off power loss $E_{off}$ characteristics of semiconductor apparatus 1, 1a. The method of manufacturing semiconductor apparatus 1, 1a of the present embodiment can reduce turn-off power loss $E_{off}$ of semiconductor apparatus 1, 1a.

In the method of manufacturing semiconductor apparatus 1, 1a of the present embodiment, first p-type semiconductor region 24 may overlap gate electrode 16 in the plan view of front surface 8. This can further suppress decreases in the hole concentrations in n-type drift region 10, first n-type buffer layer 21, and second n-type buffer layer 22 and can further reduce the electric field intensity (rear-surface electric field intensity) in the boundary region between n-type drift region 10 and first n-type buffer layer 21, in load short circuit. The method of manufacturing semiconductor apparatus 1, 1a of the present embodiment can improve the short circuit capacity in load short circuit.

In the method of manufacturing semiconductor apparatus 1, 1a of the present embodiment, doping of the first n-type dopant may include implanting the first n-type dopant into semiconductor substrate 7 several times at different acceleration voltages. First n-type buffer layer 21 may have a plurality of peak concentrations of the first n-type carriers, and the plurality of peak concentrations may decrease with an increasing distance from rear surface 9. First n-type buffer layer 21 can gently stop spreading of the depletion layer which occurs in the turn-off process. The method of manufacturing semiconductor apparatus 1, 1a of the present embodiment can suppress oscillations of a voltage across first electrode 18 and second electrode 29 after the application of a surge voltage to semiconductor apparatus 1, 1a in the turn-off process.

The method of manufacturing semiconductor apparatus 1, 1a of the present embodiment may further include activating the first n-type dopant by subjecting first n-type buffer layer 21 to furnace annealing at a temperature of 350° C. or higher and 450° C. or lower. The method of manufacturing semiconductor apparatus 1, 1a of the present embodiment can improve the short circuit capacity in load short circuit.

The method of manufacturing semiconductor apparatus 1, 1a of the present embodiment may further include activating the first n-type dopant, second n-type dopant, first p-type dopant, and second n-type dopant by collectively annealing the first n-type dopant, second n-type dopant, first p-type dopant, and second p-type dopant. The method of manufacturing semiconductor apparatus 1, 1a of the present embodiment can provide semiconductor apparatus 1, 1a having an improved short circuit capacity in load short circuit, in fewer steps.

In the method of manufacturing semiconductor apparatus 1, 1a of the present embodiment, the first n-type dopant may contain protons. The second n-type dopant may contain phosphorus or arsenic. The method of manufacturing semiconductor apparatus 1, 1a of the present embodiment can improve the short circuit capacity in load short circuit.

Embodiment 2

Figure 27:
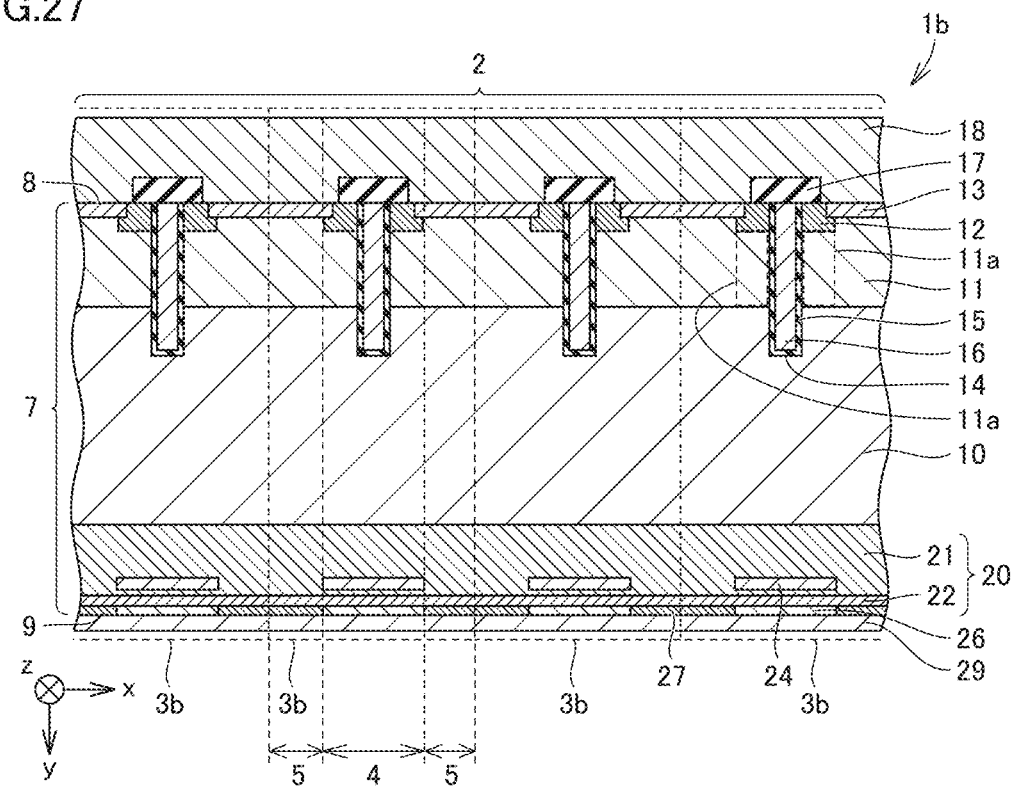
FIG. 27 is a schematic partially-enlarged sectional view of a semiconductor apparatus according to Embodiment 2.

A semiconductor apparatus 1b according to Embodiment 2 will be described with reference to FIG. 27. Semiconductor apparatus 1b of the present embodiment includes components similar to those of semiconductor apparatus 1 of Embodiment 1 but differs from semiconductor apparatus 1 mainly in the following respects.

In semiconductor apparatus 1b of the present embodiment, a semiconductor device 3b (semiconductor substrate 7) further includes an n-type semiconductor region 27. N-type semiconductor region 27 is provided in rear surface 9. N-type semiconductor region 27 is provided adjacent to p-type collector layer 26 and does not overlap gate electrode 16 in the plan view of front surface 8. In the plan view of front surface 8, n-type semiconductor region 27 does not need to overlap portion 11a of p-type base region 11. In the plan view of front surface 8, n-type semiconductor region 27 does not need to overlap n-type emitter region 12. N-type semiconductor region 27 is not provided in first region 4. N-type semiconductor region 27 is provided selectively only in second region 5. N-type semiconductor region 27 may be an $n^+$-type region. N-type semiconductor region 27 has an n-type carrier (electron) concentration higher than that of second n-type buffer layer 22.

Semiconductor apparatus 1b (semiconductor device 3b) of the present embodiment may be, for example, a reverse conducting insulated gate bipolar transistor (RC-IGBT). In semiconductor apparatus 1b (semiconductor device 3b) of the present embodiment, an IGBT and a free wheel diode (FWD) are connected in anti-parallel.

During application of a forward bias voltage to semiconductor apparatus 1b (semiconductor device 3b), that is, when the third voltage applied to second electrode 29 is higher than the second voltage applied to first electrode 18, the current flowing from second electrode 29 to first electrode 18 flows through first region 4, and first region 4 functions as an IGBT. First electrode 18 functions as an emitter electrode, and second electrode 29 functions as a collector electrode.

Upon generation of a counter electromotive force in a load (e.g., motor) connected to semiconductor apparatus 1b, a reverse bias voltage is applied to semiconductor apparatus 1b (semiconductor device 3b). That is to say, the third voltage applied to second electrode 29 is lower than the second voltage applied to first electrode 18. During application of a reverse bias voltage to semiconductor apparatus 1b, the current flowing from first electrode 18 to second electrode 29 flows through second region 5, and second region 5 functions as an FWD. First electrode 18 functions as an anode electrode, and second electrode 29 functions as a cathode electrode. P-type base region 11 functions as an anode region, and n-type semiconductor region 27 functions as a cathode region. During application of a reverse bias voltage to semiconductor apparatus 1b, the FWD (second region 5) prevents a current flow into the IGBT (first region 4). The FWD (second region 5) thus electrically protects the IGBT (first region 4) to prevent breakdown of the IGBT (first region 4).

In semiconductor apparatus 1b of the present embodiment, n-type semiconductor region 27 is provided in rear surface 9 of semiconductor substrate 7 while being adjacent to p-type collector layer 26. The area of p-type collector layer 26 in semiconductor apparatus 1b of the present embodiment is smaller than the area of p-type collector layer 26 in semiconductor apparatus 1 of Embodiment 1. In Comparative Example 2 in which first p-type semiconductor region 24 is omitted from semiconductor apparatus 1b (semiconductor device 3b) of the present embodiment, thus, the electric field intensity (rear-surface electric field intensity) in the boundary region between n-type drift region 10 and first n-type buffer layer 21 becomes higher and the hole concentrations in n-type drift region 10 and first n-type buffer layer 21 become lower than in Comparative Example 1. The semiconductor apparatus of Comparative Example 2 has a short circuit capacity in load short circuit which is lower than that of the semiconductor apparatus of Comparative Example 1.

Semiconductor apparatus 1b (semiconductor device 3b) of the present embodiment includes first p-type semiconductor region 24. In load short circuit, first p-type semiconductor region 24 suppresses decreases in the hole concentrations in n-type drift region 10 and first n-type buffer layer 21 and also decreases the electric field intensity (rear-surface electric field intensity) in the boundary region between n-type drift region 10 and first n-type buffer layer 21. Semiconductor apparatus 1b of the present embodiment can improve the short circuit capacity in load short circuit. Although semiconductor apparatus 1b of the present embodiment includes a trench gate IGBT, it may include a planar gate IGBT (see FIG. 26) in place of the trench gate IGBT.

An example of the method of manufacturing semiconductor apparatus 1b according to Embodiment 2 will be described with reference to FIGS. 27 to 31. The method of manufacturing semiconductor apparatus 1b of the present embodiment includes steps similar to those of the method of manufacturing semiconductor apparatus 1 of Embodiment 1 but differs from the method of Embodiment 1 mainly in the following respects.

Figure 28:
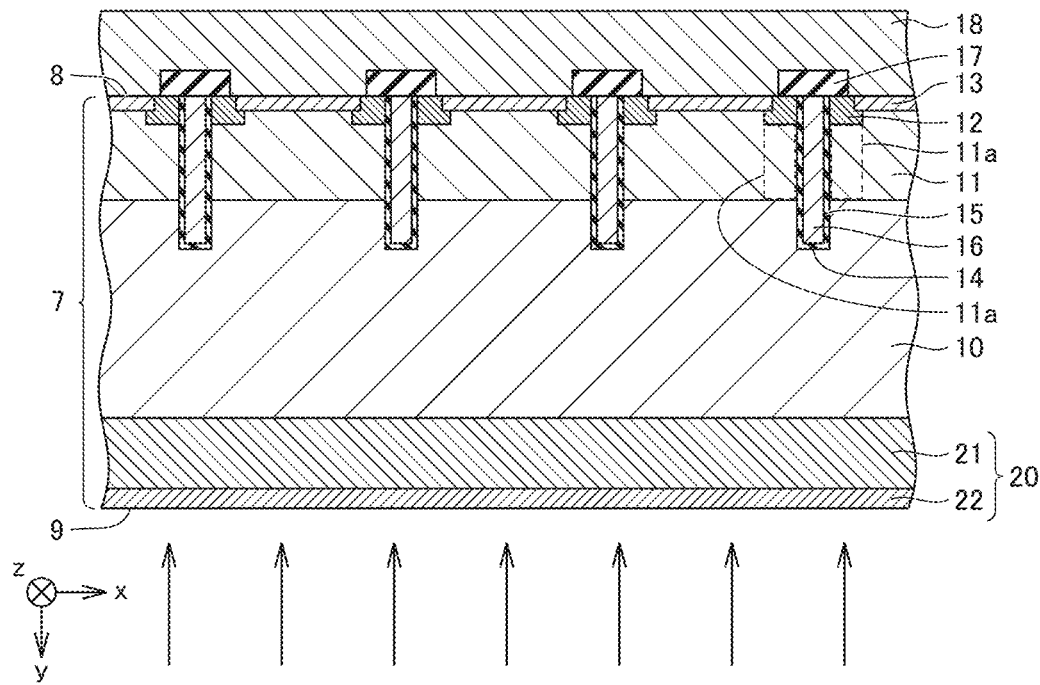
FIG. 28 is a schematic partially-enlarged sectional view showing one step of a method of manufacturing the semiconductor apparatus according to Embodiment 2.

The method of manufacturing semiconductor apparatus 1b of the present embodiment includes the steps shown in FIGS. 3 to 6. Additionally, as shown in FIG. 28, the method of manufacturing semiconductor apparatus 1b of the present embodiment includes forming second n-type buffer layer 22 by doping with the second n-type dopant from rear surface 9 of semiconductor substrate 7. The step of forming second n-type buffer layer 22 shown in FIG. 28 may be similar to the step shown in FIGS. 9 and 10.

Figure 29:
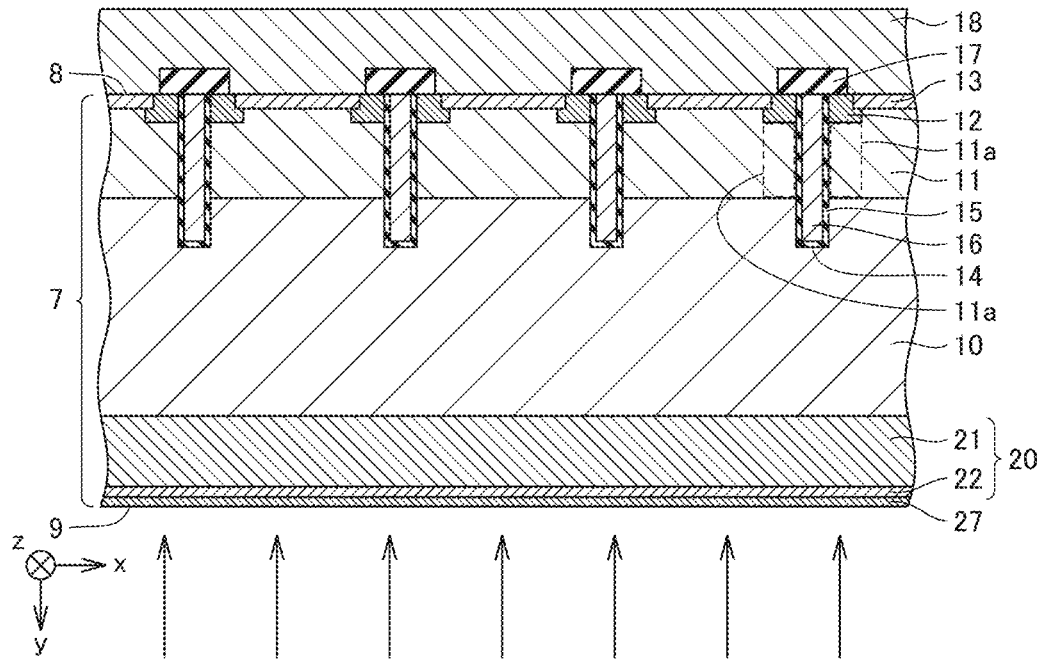
FIG. 29 is a schematic partially-enlarged sectional view showing a step following the step shown in FIG. 28 in the method of manufacturing the semiconductor apparatus according to Embodiment 2.

As shown in FIG. 29, the method of manufacturing semiconductor apparatus 1b of the present embodiment further includes forming n-type semiconductor region 27 in rear surface 9 by doping with the third n-type dopant from rear surface 9 of semiconductor substrate 7. N-type semiconductor region 27 is in contact with second n-type buffer layer 22 and is provided on a rear surface 9 side with respect to second n-type buffer layer 22. The maximum peak concentration of third n-type carriers (electrons) contained in n-type semiconductor region 27 is higher than the second maximum peak concentration of the second n-type carriers contained in second n-type buffer layer 22. N-type semiconductor region 27 may be thinner than second n-type buffer layer 22.

The third n-type dopant may be, for example, phosphorus or arsenic. Specifically, n-type semiconductor region 27 may be formed by implanting phosphorus or arsenic into second n-type buffer layer 22 with an ion implanter. The acceleration voltage of the third n-type dopant is lower than the acceleration voltage of the second n-type dopant. N-type semiconductor region 27 may be annealed in order to activate the third n-type dopant.

Figure 30:
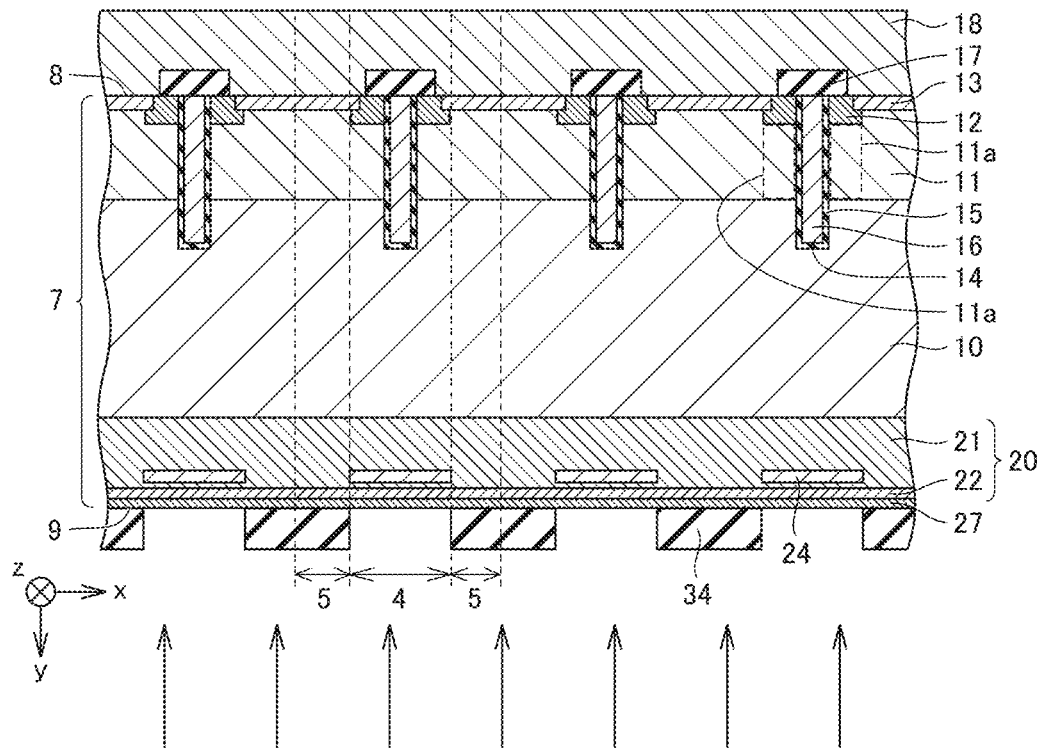
FIG. 30 is a schematic partially-enlarged sectional view showing a step following the step shown in FIG. 29 in the method of manufacturing the semiconductor apparatus according to Embodiment 2.

As shown in FIG. 30, the method of manufacturing semiconductor apparatus 1b of the present embodiment includes forming first p-type semiconductor region 24 in first n-type buffer layer 21 by doping with the first p-type dopant from rear surface 9 of semiconductor substrate 7. Specifically, mask 34 having opening 34a is formed on rear surface 9 of semiconductor substrate 7. The first p-type dopant is implanted into first n-type buffer layer 21 through opening 34a of mask 34. The step of forming first p-type semiconductor region 24 shown in FIG. 30 may be similar to the step shown in FIGS. 7 and 8.

Figure 31:
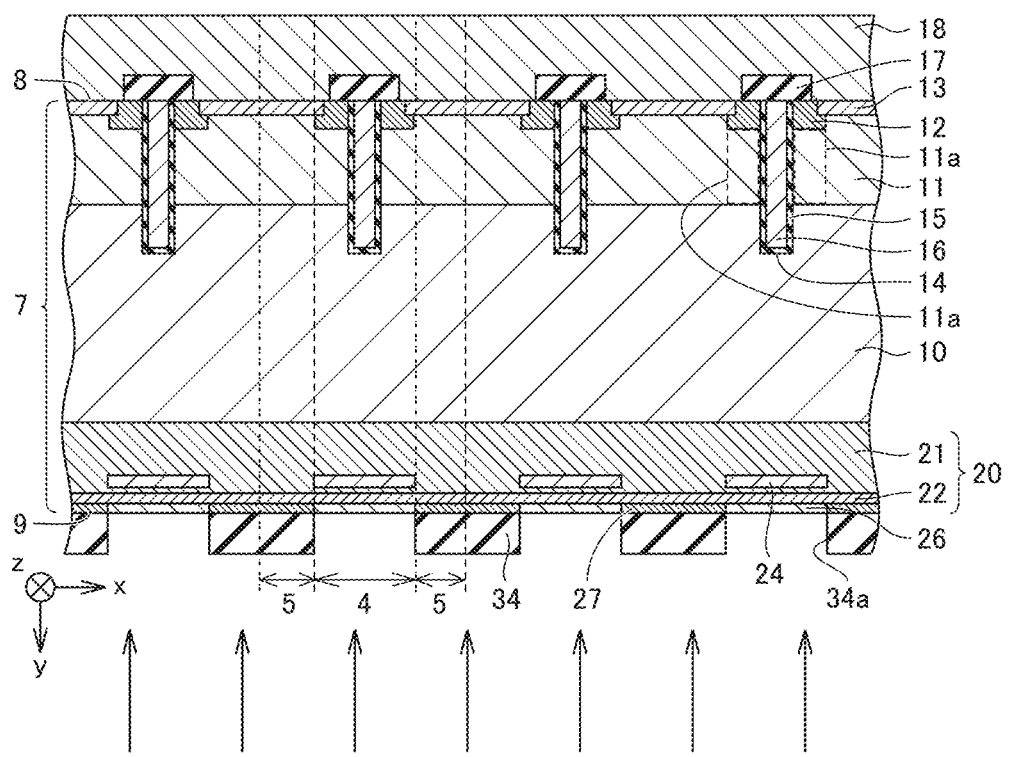
FIG. 31 is a schematic partially-enlarged sectional view showing a step following the step shown in FIG. 30 in the method of manufacturing the semiconductor apparatus according to Embodiment 2.

As shown in FIG. 31, the method of manufacturing semiconductor apparatus 1b of the present embodiment includes forming p-type collector layer 26 in rear surface 9 by doping with the second p-type dopant from rear surface 9 of semiconductor substrate 7. The second p-type dopant may be, for example, boron. Forming of p-type collector layer 26 includes doping n-type semiconductor region 27 with the second p-type dopant. Specifically, p-type collector layer 26 may be formed by implanting boron into n-type semiconductor region 27 with an ion implanter. P-type collector layer 26 is provided adjacent to n-type semiconductor region 27 and overlaps gate electrode 16 in the plan view of front surface 8. N-type semiconductor region 27 is provided adjacent to p-type collector layer 26 and does not overlap gate electrode 16 in the plan view of front surface 8.

Specifically, mask 34 having opening 34a is formed on rear surface 9 of semiconductor substrate 7. First p-type semiconductor region 24 and p-type collector layer 26 may be formed with an identical mask 34. First region 4 including gate electrode 16 is exposed through opening 34a of mask 34. Second region 5 free from gate electrode 16 is covered with mask 34. The second p-type dopant is implanted into n-type semiconductor region 27 through opening 34a of mask 34. The second p-type dopant is implanted only into n-type semiconductor region 27 in first region 4. The second p-type dopant is not implanted into n-type semiconductor region 27 in second region 5. Consequently, p-type collector layer 26 is formed selectively only in first region 4. As shown in FIG. 12, p-type collector layer 26 may be annealed in order to activate the second p-type dopant.

The method of manufacturing semiconductor apparatus 1b of the present embodiment includes forming second electrode 29 on p-type collector layer 26 and n-type semiconductor region 27. Second electrode 29, p-type collector layer 26, and n-type semiconductor region 27 may be annealed in order to bring second electrode 29 into ohmic contact with p-type collector layer 26 and n-type semiconductor region 27. Consequently, semiconductor apparatus 1b of the present embodiment shown in FIG. 27 is obtained.

In one example of the method of manufacturing semiconductor apparatus 1b of the present embodiment described above, first n-type buffer layer 21, second n-type buffer layer 22, n-type semiconductor region 27, first p-type semiconductor region 24, and p-type collector layer 26 are formed in the stated order. In contrast, in another example of the method of manufacturing semiconductor apparatus 1b of the present embodiment, first n-type buffer layer 21, second n-type buffer layer 22, n-type semiconductor region 27, first p-type semiconductor region 24, and p-type collector layer 26 may be formed in an order different from that of one example of the method of manufacturing semiconductor apparatus 1b of the present embodiment.

The effects of semiconductor apparatus 1b and the method of manufacturing the same according to the present embodiment will be described. Semiconductor apparatus 1b and the method of manufacturing the same according to the present embodiment have the following effects in addition to the effects of semiconductor apparatus 1 and the method of manufacturing the same according to Embodiment 1.

In semiconductor apparatus 1b of the present embodiment, semiconductor device 3b further includes n-type semiconductor region 27. N-type semiconductor region 27 is provided in rear surface 9. N-type semiconductor region 27 is provided adjacent to p-type collector layer 26 and does not overlap gate electrode 16 in the plan view of front surface 8.

During application of a forward bias voltage to semiconductor apparatus 1b, the region (first region 4) of semiconductor substrate 7 in which p-type collector layer 26 is formed functions as an IGBT. During application of a reverse bias voltage to semiconductor apparatus 1b due to the generation of a counter electromotive force in a load (e.g., motor) connected to semiconductor apparatus 1b, the region (second region 5) of semiconductor substrate 7 in which n-type semiconductor region 27 is formed functions as an FWD. Semiconductor apparatus 1b of the present embodiment can prevent breakdown of the region (first region 4, IGBT) in which p-type collector layer 26 is formed, at the occurrence of a counter electromotive force in the load (e.g., motor) connected to semiconductor apparatus 1b.

The method of manufacturing semiconductor apparatus 1b of the present embodiment further includes forming n-type semiconductor region 27 in rear surface 9 by doping with the third n-type dopant from rear surface 9. Forming of p-type collector layer 26 includes doping n-type semiconductor region 27 with the second p-type dopant. N-type semiconductor region 27 is provided adjacent to p-type collector layer 26 and does not overlap gate electrode 16 in the plan view of front surface 8. The method of manufacturing semiconductor apparatus 1b of the present embodiment can prevent breakdown of the region (first region 4, IGBT) in which p-type collector layer 26 is formed, at the occurrence of a counter electromotive force in the load (e.g., motor) connected to semiconductor apparatus 1b.

In the method of manufacturing semiconductor apparatus 1b of the present embodiment, first p-type semiconductor region 24 and p-type collector layer 26 may be formed with an identical mask 34. The method of manufacturing semiconductor apparatus 1b of the present embodiment can provide semiconductor apparatus 1b having an improved short circuit capacity in load short circuit, in fewer steps.

Embodiment 3

Figure 32:
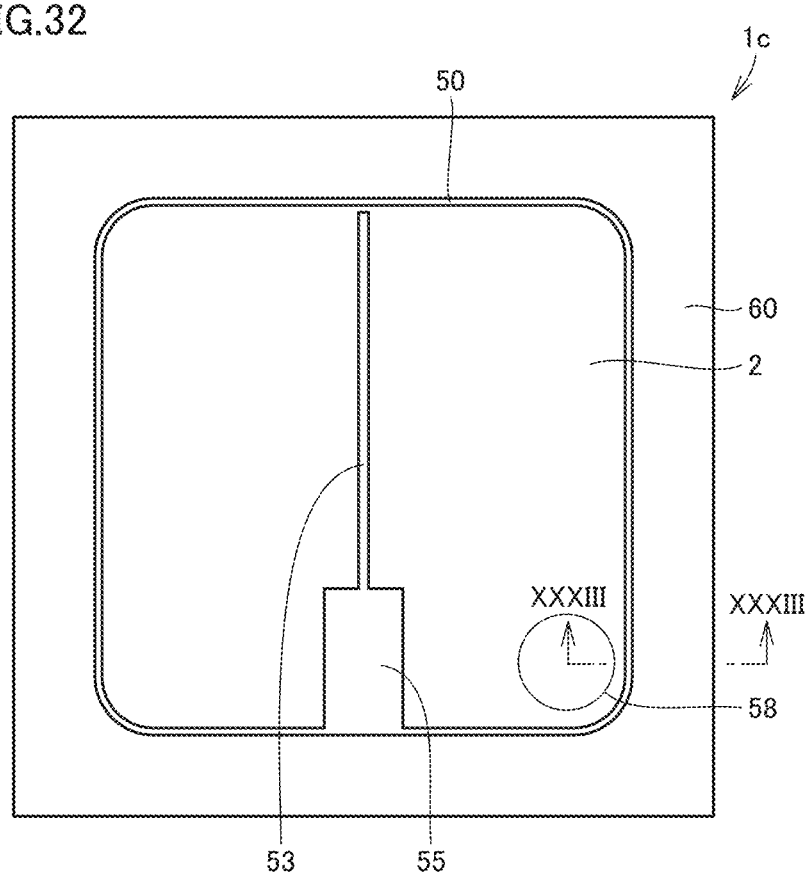
FIG. 32 is a schematic plan view of a semiconductor apparatus according to Embodiment 3.
Figure 33:
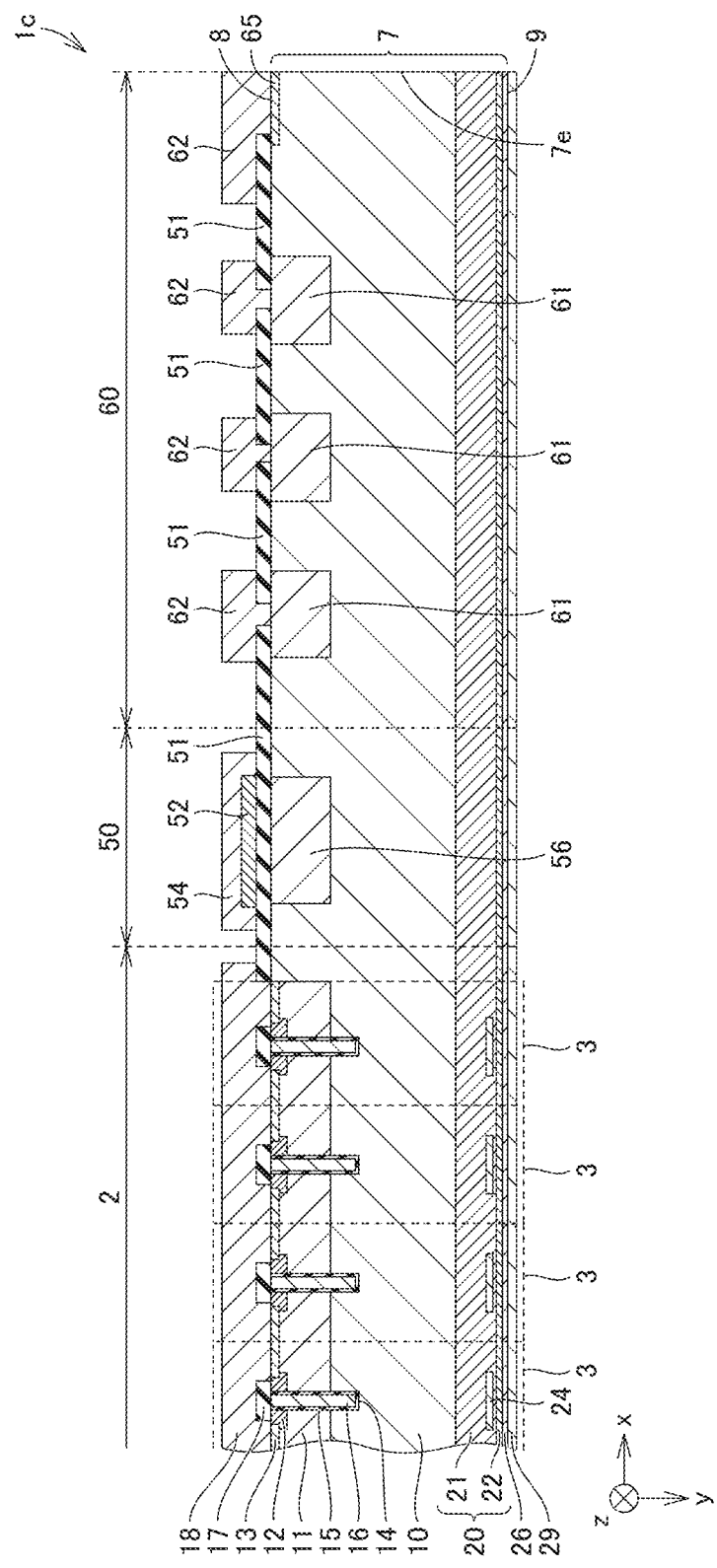
FIG. 33 is a schematic partially-enlarged sectional view of the semiconductor apparatus according to Embodiment 3, which is taken along a section line XXXIII-XXXIII shown in FIG. 32.

A semiconductor apparatus 1c according to Embodiment 3 will be described with reference to FIGS. 32 and 33. Semiconductor apparatus 1c of the present embodiment includes similar components to those of semiconductor apparatus 1 of Embodiment 1 but differs from semiconductor apparatus 1 mainly in the following respects.

In semiconductor apparatus 1c of the present embodiment, semiconductor substrate 7 further includes a peripheral region 60 surrounding cell region 2. Specifically, semiconductor substrate 7 may include an intermediate region 50 surrounding cell region 2 in the plan view of front surface 8 and peripheral region 60 surrounding intermediate region 50 in the plan view of front surface 8. N-type drift region 10, first n-type buffer layer 21, second n-type buffer layer 22, p-type collector layer 26, and second electrode 29 included in cell region 2 extend also to intermediate region 50 and peripheral region 60. P-type base region 11, n-type emitter region 12, and first electrode 18 are not formed in intermediate region 50 and peripheral region 60.

Gate interconnections 52 and 53 are formed on front surface 8 of semiconductor substrate 7 with interlayer insulation film 51 between gate interconnections 52 and 53 and front surface 8. Gate interconnections 52 and 53 may be covered with a conductive film 54. Conductive film 54 may be formed in the same step for first electrode 18. Gate interconnection 52 is formed in intermediate region 50 and surrounds cell region 2 in the plan view of front surface 8. A gate pad 55 is formed on front surface 8 of semiconductor substrate 7 with interlayer insulation film 51 between gate pad 55 and front surface 8. Gate interconnections 52 and 53 are connected to gate pad 55. Gate interconnection 53 extends from gate pad 55 to cell region 2. In front surface 8 of semiconductor substrate 7 in intermediate region 50, a second p-type semiconductor region 56 is formed. Gate interconnection 52 faces second p-type semiconductor region 56 with interlayer insulation film 51 therebetween. Interlayer insulation film 51 electrically insulates second p-type semiconductor region 56 from gate interconnection 52.

Peripheral region 60 includes at least one guard ring 61 provided in front surface 8 of semiconductor substrate 7. In the plan view of front surface 8, guard ring 61 surrounds cell region 2. Guard ring 61 may be a $p^+$-type region. A channel stopper region 65 is formed in the outermost portion of peripheral region 60. Channel stopper region 65 may be an $n^+$-type region. Interlayer insulation film 51 is formed on front surface 8 of semiconductor substrate 7. Third electrodes 62 are formed on guard ring 61 and channel stopper region 65 which are exposed from interlayer insulation film 51. In the plan view of front surface 8, third electrodes 62 each surround cell region 2.

Guard ring 61 relaxes electric field concentration in peripheral region 60. Guard ring 61 improves the breakdown voltage of semiconductor apparatus 1c. Channel stopper region 65 prevents a depletion layer extending from a pn junction formed between guard ring 61 and n-type drift region 10 from reaching an end surface 7e of semiconductor substrate 7.

In semiconductor apparatus 1c of the present embodiment, first p-type semiconductor region 24 is not formed in peripheral region 60. First p-type semiconductor region 24 is formed selectively only in cell region 2. This can improve the interruption capacity of semiconductor apparatus 1c in the turn-off process.

Specifically, when the first voltage applied to gate electrode 16 falls below a threshold voltage in the turn-off process, semiconductor apparatus 1c (semiconductor device 3b) temporarily operates as a pnp transistor. Since first p-type semiconductor region 24 is not formed in peripheral region 60, a hole flow from p-type collector layer 26 in peripheral region 60 to cell region 2 can be reduced. In the turn-off process, holes can be ejected from cell region 2 in a shorter time. In the turn-off process, latch-up of semiconductor apparatus 1c in a corner portion 58 of cell region 2 can be prevented. In the turn-off process, an increase of an electric field within semiconductor substrate 7 at corner portion 58 of cell region 2 can be suppressed. Consequently, the interruption capacity of semiconductor apparatus 1c in the turn-off process can be improved.

In ON state of semiconductor apparatus 1c of the present embodiment, the electrons injected from n-type emitter region 12 mainly flow toward p-type collector layer 26 in cell region 2. The ON-state voltage of semiconductor apparatus 1c of the present embodiment is thus substantially equal to the ON-state voltage of the semiconductor apparatus in which first p-type semiconductor region 24 is formed also in peripheral region 60. Although semiconductor apparatus 1b of the present embodiment includes a trench gate IGBT, it may include a planar gate IGBT (see FIG. 26) in place of the trench gate IGBT.

The effects of semiconductor apparatus 1c of the present embodiment will be described. Semiconductor apparatus 1c of the present embodiment achieves the following effects in addition to the effects of semiconductor apparatus 1 of Embodiment 1.

In semiconductor apparatus 1c of the present embodiment, semiconductor substrate 7 further includes peripheral region 60 surrounding cell region 2. Peripheral region 60 includes guard ring 61 provided in front surface 8. Guard ring 61 surrounds cell region 2. Semiconductor apparatus 1c of the present embodiment can improve the breakdown voltage of semiconductor apparatus 1c.

In semiconductor apparatus 1c of the present embodiment, first p-type semiconductor region 24 is not formed in peripheral region 60. Semiconductor apparatus 1c of the present embodiment can improve the interruption capacity of semiconductor apparatus 1c in the turn-off process.

It should be understood that Embodiments 1 to 3 disclosed herein are illustrative and non-restrictive in every respect. The scope of the present invention is defined by the scope of the claims, rather than the description above, and is intended to include any modifications within the scope and meaning equivalent to the scope of the claims.

What is claimed is:

1. A semiconductor apparatus comprising a semiconductor substrate including a cell region in which a semiconductor device is provided, the semiconductor substrate having a front surface and a rear surface,
    the semiconductor device including an n-type drift region, a p-type base region, an n-type emitter region, a gate insulating layer provided on a portion of the p-type base region sandwiched between the n-type emitter region and the n-type drift region, a gate electrode facing the portion of the p-type base region with the gate insulating layer between the gate electrode and the portion, a p-type collector layer provided in the rear surface, a first n-type buffer layer, a second n-type buffer layer, and a first p-type semiconductor region,
    the first n-type buffer layer being in contact with the n-type drift region and being provided on a rear surface side with respect to the n-type drift region,
    the second n-type buffer layer being in contact with the first n-type buffer layer and being provided on a rear surface side with respect to the first n-type buffer layer, a first maximum peak concentration of first n-type carriers in the first n-type buffer layer being lower than a second maximum peak concentration of second n-type carriers in the second n-type buffer layer, the first n-type buffer layer being thicker than the second n-type buffer layer,
    the first p-type semiconductor region being formed in the first n-type buffer layer,
    the first p-type semiconductor region having a narrower width than the first n-type buffer layer in a direction in which the n-type emitter region and the gate electrode are arranged,
    the first p-type semiconductor region being spaced away from the p-type collector layer and the p-type base region.

2. The semiconductor apparatus according to claim 1, wherein the first p-type semiconductor region overlaps the gate electrode in a plan view of the front surface.

3. The semiconductor apparatus according to claim 2, wherein
    the semiconductor device further includes an n-type semiconductor region,
    the n-type semiconductor region is provided in the rear surface, and
    the n-type semiconductor region is provided adjacent to the p-type collector layer and does not overlap the gate electrode in the plan view.

4. The semiconductor apparatus according to claim 1, wherein a third maximum peak concentration of first p-type carriers in the first p-type semiconductor region is higher than the second maximum peak concentration of the second n-type carriers in the second n-type buffer layer.

5. The semiconductor apparatus according to claim 1, wherein the first p-type semiconductor region is thicker than the p-type collector layer.

6. The semiconductor apparatus according to claim 1, wherein the first n-type buffer layer has a plurality of peak concentrations of the first n-type carriers, and the plurality of peak concentrations decrease with an increasing distance from the rear surface.

7. The semiconductor apparatus according to claim 1, wherein
    the first n-type buffer layer contains protons, and
    the second n-type buffer layer contains phosphorus or arsenic.

8. The semiconductor apparatus according to claim 1, wherein
    the semiconductor substrate further includes a peripheral region surrounding the cell region, and
    the peripheral region includes a guard ring provided in the front surface, and the guard ring surrounds the cell region.

9. The semiconductor apparatus according to claim 8, wherein the first p-type semiconductor region is not formed in the peripheral region.

10. A method of manufacturing a semiconductor apparatus, the method comprising:
    preparing a semiconductor substrate, the semiconductor substrate having a front surface and a rear surface, the semiconductor substrate including, in a cell region of the semiconductor substrate, an n-type drift region, a p-type base region, an n-type emitter region, a gate insulating layer provided on a portion of the p-type base region sandwiched between the n-type emitter region and the n-type drift region, and a gate electrode facing the portion of the p-type base region with the gate insulating layer between the gate electrode and the portion;
    forming a first n-type buffer layer by doping with a first n-type dopant from the rear surface, the first n-type buffer layer being in contact with the n-type drift region and being provided on a rear surface side with respect to the n-type drift region;
    forming a first p-type semiconductor region in the first n-type buffer layer by doping with a first p-type dopant from the rear surface, the first p-type semiconductor region having a narrower width than that of the first n-type buffer layer in a direction in which the n-type emitter region and the gate electrode are arranged;
    forming a second n-type buffer layer by doping with a second n-type dopant from the rear surface, the second n-type buffer layer being in contact with the first n-type buffer layer and being provided on a rear surface side with respect to the first n-type buffer layer, a first maximum peak concentration of first n-type carriers in the first n-type buffer layer being lower than a second maximum peak concentration of second n-type carriers in the second n-type buffer layer, the first n-type buffer layer being thicker than the second n-type buffer layer; and
    forming a p-type collector layer in the rear surface by doping with a second p-type dopant from the rear surface;
    the first p-type semiconductor region being spaced away from the p-type collector layer and the p-type base region.

11. The method of manufacturing a semiconductor apparatus according to claim 10, wherein the first p-type semiconductor region overlaps the gate electrode in a plan view of the front surface.

12. The method of manufacturing a semiconductor apparatus according to claim 11, further comprising forming an n-type semiconductor region in the rear surface by doping with a third n-type dopant from the rear surface, wherein the forming of the p-type collector layer includes doping the n-type semiconductor region with the second p-type dopant, and the n-type semiconductor region is provided adjacent to the p-type collector layer and does not overlap the gate electrode in the plan view.

13. The method of manufacturing a semiconductor apparatus according to claim 12, wherein the first p-type semiconductor region and the p-type collector layer are formed with an identical mask.

14. The method of manufacturing a semiconductor apparatus according to claim 10, wherein the doping with the first n-type dopant includes implanting the first n-type dopant into the semiconductor substrate a plurality of times at different acceleration voltages, and the first n-type buffer layer has a plurality of peak concentrations of the first n-type carriers, and the plurality of peak concentrations decrease with an increasing distance from the rear surface.

15. The method of manufacturing a semiconductor apparatus according to claim 10, further comprising activating the first n-type dopant by subjecting the first n-type buffer layer to furnace annealing at a temperature of 350° C. or higher and 450° C. or lower.

16. The method of manufacturing a semiconductor apparatus according to claim 10, further comprising activating the first n-type dopant, the second n-type dopant, the first p-type dopant, and the second p-type dopant by collectively annealing the first n-type dopant, the second n-type dopant, the first p-type dopant, and the second p-type dopant.

17. The method of manufacturing a semiconductor apparatus according to claim 10, wherein the first n-type dopant contains protons, and the second n-type dopant contains phosphorus or arsenic.

* * * * *